(12) United States Patent
Morita et al.

(10) Patent No.: US 8,064,241 B2
(45) Date of Patent: Nov. 22, 2011

(54) SEMICONDUCTOR MEMORY INCLUDING VOLTAGE DETECTION CIRCUIT FOR GENERATING SENSE AMPLIFIER SIGNAL

(75) Inventors: Keizo Morita, Kawasaki (JP); Kenichi Nakabayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/603,065

(22) Filed: Oct. 21, 2009

(65) Prior Publication Data

US 2010/0039851 A1    Feb. 18, 2010

Related U.S. Application Data

(63) Continuation of application No. PCT/JP2007/000533, filed on May 18, 2007.

(51) Int. Cl.
*G11C 11/22* (2006.01)
(52) U.S. Cl. .......... 365/145; 365/189.09; 365/194
(58) Field of Classification Search ............... 365/194, 365/205, 207, 145, 189.09
See application file for complete search history.

(56) References Cited

U.S. PATENT DOCUMENTS

| | | | |
|---|---|---|---|
| 5,357,468 A | 10/1994 | Satani et al. | |
| 6,661,697 B2 | 12/2003 | Yamamoto et al. | |
| 6,836,426 B1 | 12/2004 | Fukushi et al. | |
| 2002/0080670 A1 | 6/2002 | Kawasumi | |
| 2003/0202412 A1 | 10/2003 | Nii et al. | |
| 2004/0062115 A1* | 4/2004 | Takeuchi et al. ........... | 365/202 |
| 2004/0183508 A1* | 9/2004 | Toyoda et al. ............. | 323/265 |
| 2005/0195639 A1* | 9/2005 | Fukushi et al. ............. | 365/149 |
| 2005/0207239 A1 | 9/2005 | Kodama | |
| 2006/0023485 A1 | 2/2006 | Yamamura | |
| 2008/0247227 A1* | 10/2008 | Tonomura et al. .......... | 365/163 |

FOREIGN PATENT DOCUMENTS

| | | |
|---|---|---|
| JP | 07-050094 A | 2/1995 |
| JP | 09-231771 A | 9/1997 |
| JP | 11-203873 A | 7/1999 |
| JP | 2002-133857 A | 5/2002 |
| JP | 2002-260386 A | 9/2002 |
| JP | 2003-323792 A | 11/2003 |

(Continued)

OTHER PUBLICATIONS

International Search Report of PCT/JP2007/000533. mailing date of Feb. 26, 2008.

(Continued)

*Primary Examiner* — Ahn Phung
*Assistant Examiner* — Hein Nguyen
(74) *Attorney, Agent, or Firm* — Fujitsu Patent Center

(57) ABSTRACT

A voltage detection circuit outputs a detection signal when an amount of charges read to one of a pair of bit lines reaches a predetermined amount. A mask circuit of a timing generator masks an output of a sense amplifier activation signal until the detection signal is output. A sense amplifier determines logics of data read to the bit lines from memory cells in synchronization with the sense amplifier activation signal. An operation of the sense amplifier is started after predetermined amounts of charges are read from the memory cells to the bit lines, that is, after the detection signal is output. Accordingly, even when a timing to output a timing signal becomes early due to a variance of manufacturing conditions of a semiconductor memory, data read from the memory cells can be latched correctly in the sense amplifier. As a result, malfunctions of the semiconductor memory can be prevented.

11 Claims, 22 Drawing Sheets

FOREIGN PATENT DOCUMENTS

| | | |
|---|---|---|
| JP | 2005-129151 A | 5/2005 |
| JP | 2006-31798 A | 2/2006 |

OTHER PUBLICATIONS

Shoichiro Kawashima, et al, "Bitline GND Sensing Technique for Low-Voltage Operation FeRAM", Journal of Solid-State Circuits, May 2002, pp. 592-597, vol. 37, No. 5.

Notification Concerning Transmittal of Translation of International Preliminary Report on Patentability (Form PCT/IB/326) of International Application No. PCT/JP2007/000533 mailed Dec. 3, 2009 with Forms PCT/IB/373, PCT/ISA/237 and PCT/IB/338.

Supplementary European Search Report mailed Jun. 29, 2011 for corresponding European Application No. EP 07 73 7189.

* cited by examiner

SEMICONDUCTOR MEMORY INCLUDING VOLTAGE DETECTION CIRCUIT FOR GENERATING SENSE AMPLIFIER SIGNAL

CROSS-REFERENCE TO RELATED APPLICATIONS

This application is based upon and claims the benefit of priority of the prior International Patent Application No. PCT/JP2007/000533, filed on May 18, 2007, the entire contents of which are incorporated herein by reference.

FIELD

The present embodiments relate to a semiconductor memory having memory cells made of ferroelectric capacitors which retain logical values of data as electric charges.

BACKGROUND

A ferroelectric memory composed of memory cells each including a ferroelectric capacitor is developed as a semiconductor memory device which has both advantages of DRAMs and flash memories/EEPROMs. The ferroelectric memory operates the ferroelectric capacitor made of ferroelectric material, which is insulating material, as a variable capacitor. The ferroelectric memory can hold data without a power supply, by utilizing residual dielectric polarization which is left even when no voltage is applied to the ferroelectric capacitor.

In recent years, there has been proposed a technique for reading a ferroelectric memory referred to as bit line GND sensing technique. According to this type of reading technique, in order to prevent fluctuation in voltage of bit lines when applying a voltage to plate lines, charges are read out from memory cells to the bit lines and are transferred to charge storing circuits through charge transferring circuits referred to as charge transfers which are formed in pre-sense amplifiers. The amounts of charges transferred to the charge storing circuits are converted to voltages. Then the logical values corresponding to the converted voltages are latched by the sense amplifiers at the predetermined timing, and the logical values of the data retained in the memory cells are read (for example, refer to Japanese Laid-open Patent publication No. 2002-133857).

Further, there has been proposed a technique such that a detection signal is output when output voltages of the pre-sense amplifiers reach a predetermined voltage, and data read from complementary bit lines in synchronization with the detection signal are latched in the sense amplifiers (for example, refer to Japanese Laid-open Patent publication No. 2005-129151).

In general, in the read operation and the write operation of a semiconductor memory, control circuits such as an address decoder, a word driver and a sense amplifier are operated sequentially. Accordingly, for example, timing signals for these control circuits are generated sequentially using cascade-coupled delay circuits. The delay circuits are made of transistors and so on, and thus delay times of the delay circuits disperse due to a variance of manufacturing conditions of the semiconductor memory. On the other hand, changes in voltages read to the bit lines from the memory cells are constant without depending on characteristics of the transistors. Accordingly, for example, when threshold voltages of the transistors are low, it is possible that the sense amplifiers latch data before charges are read sufficiently to the bit lines from the memory cells. When the pre-sense amplifiers are coupled to the bit lines, it is possible that the sense amplifiers latch data before output voltages of the pre-sense amplifiers become sufficiently large. In these cases, the semiconductor memory malfunctions.

Further, the amounts of charges read to the bit lines vary due to, for example, dispersion of manufacturing conditions of memory cell capacitors. For example, when the capacitance values of manufactured capacitors are small, the amounts of charges read to the bit lines become small. With the technique in which a detection signal is generated using pre-sense amplifiers and data are latched in sense amplifiers in synchronization with the detection signal, when output voltages of the pre-sense amplifiers do not reach a predetermined voltage, the detection signal will not be output and hence the sense amplifiers are unable to latch data. When this happens, the semiconductor memory malfunctions.

SUMMARY

In one aspect of the present embodiments, memory cells each has a capacitor capable of storing an electric charge corresponding to a logic of data, and is coupled to bit lines. A voltage detection circuit is provided corresponding to a pair of the bit lines from which complementary data are read. The voltage detection circuit outputs a detection signal when an amount of charges read to one of the pair of the bit lines reaches a predetermined amount when the memory cells are accessed. A timing generator has a plurality of cascade-coupled delay circuits, outputs timing signals from each of the delay circuits, and outputs a sense amplifier activation signal in response to one of the timing signals. The timing generator has a mask circuit masking an output of the sense amplifier activation signal until the detection signal is output. A delay circuit in a next stage of one of the delay circuits outputting the one of the timing signals operates upon reception of the sense amplifier activation signal. A sense amplifier determines logics of data read to the bit lines from the memory cells in synchronization with the sense amplifier activation signal.

In another aspect of the present embodiments, each memory cell has a capacitor capable of storing an electric charge corresponding to a logic of data, and is coupled to bit lines. A voltage detection circuit is provided corresponding to a pair of the bit lines from which complementary data are read. The voltage detection circuit outputs a detection signal when an amount of charges read to one of the pair of the bit lines reaches a predetermined amount when the memory cells are accessed. A timing generator has a plurality of cascade-coupled delay circuits, outputs timing signals from each of the delay circuits, and outputs a sense amplifier activation signal in response to either one of the detection signal and one of the timing signals. A sense amplifier determines logics of data read to the bit lines from the memory cells in synchronization with the sense amplifier activation signal.

In a preferred example of the one aspect of the present embodiments, pre-sense amplifiers coupled to each of the bit lines amplify voltage amplitude of data read from the memory cells via the bit lines. The voltage detection circuit is coupled to a pair of the pre-sense amplifiers amplifying complementary data, and outputs the detection signal when a voltage value of data amplified by one of the pair of the pre-sense amplifiers reaches a first voltage when the memory cells are accessed. The sense amplifier determines logics read to the bit lines from the memory cells upon reception of data amplified by the pre-sense amplifiers.

In a preferred example of the one aspect of the present embodiments, in addition to the delay circuits described above, a delay circuit is provided which outputs a time-out signal at a predetermined time after data is read from the memory cells to the bit lines. The mask circuit has a mask release circuit releasing a mask in response to an output of the time-out signal, so as to output the sense amplifier activation signal also when the detection signal is not output.

In the present embodiments, an operation of a sense amplifier is started after predetermined amounts of charges are read from memory cells to bit lines (that is, after a detection signal is output). Accordingly, even when a timing to output a timing signal becomes early due to a variance of manufacturing conditions of a semiconductor memory, data read from the memory cells can be latched correctly in the sense amplifier. Furthermore, a delay circuit in a latter stage operates upon reception of a sense amplifier activation signal, and thus an operation timing of a circuit that operates after the sense amplifier latches data can be set according to a latch timing of the sense amplifier. As a result, malfunctions of the semiconductor memory can be prevented.

Further, in the present embodiments, the sense amplifier activation signal is output in response to either one of the detection signal and one of timing signals. Alternatively, the sense amplifier activation signal is output in response to either one of a time-out signal and the detection signal. For example, when capacitance values of capacitors are small and amounts of charges read to the bit lines from the memory cells are small, a voltage detection circuit is unable to output the detection signal. Another possibility is that an output timing of the detection signal becomes late largely. Even in such cases, the sense amplifier can be operated securely at a predetermined timing, and data read from the memory cells can be latched correctly in the sense amplifier. Therefore, malfunctions of the semiconductor memory can be prevented.

DESCRIPTION OF EMBODIMENTS

Figure 1:
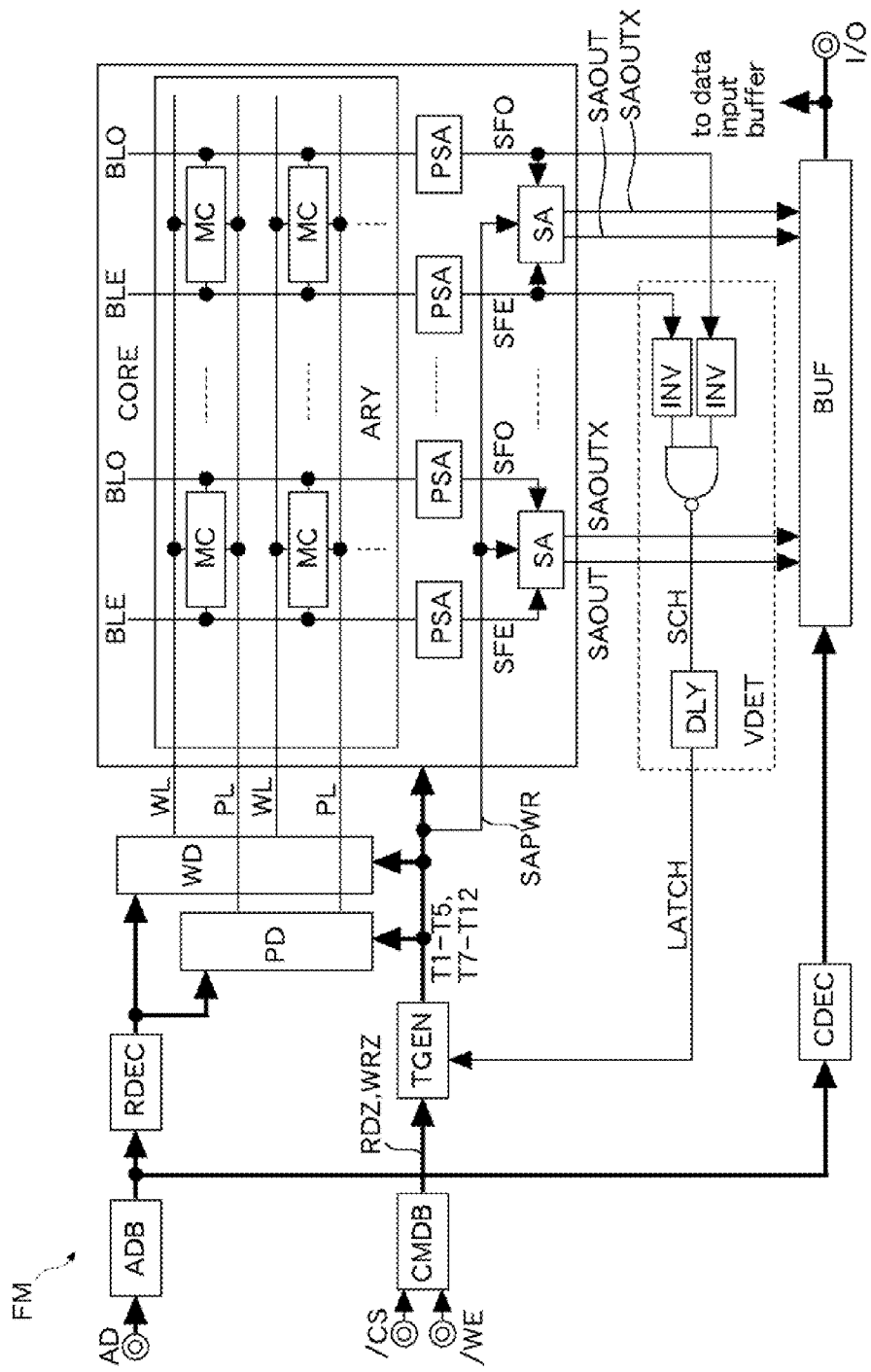
FIG. 1 illustrates a block diagram depicting a first embodiment of the semiconductor memory of the present invention.

Hereinafter, embodiments will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting signals are designated by the same reference symbols as the names of the signals. Signals ending in "Z" are of positive logic. Signals ending in "X" and signals heading in "/" are of negative logic.

FIG. 1 illustrates a first embodiment of the semiconductor memory of the present invention. This semiconductor memory is formed as a ferroelectric memory FM on a silicon substrate by using CMOS processes. The ferroelectric memory FM is used, for example, as a work memory of wireless tag (RFID) such as an IC card and as a work memory of a hand-held terminal such as a cellular phone. The ferroelectric memory FM has an address buffer ADB, a command buffer CMDB, a row decoder RDEC, a timing generator TGEN, a column decoder CDEC, a plate driver PD, a word driver WD, a memory core CORE, a voltage detection circuit VDET and a data output buffer BUF. FIG. 1 chiefly depicts those circuits necessary for a read operation. Thus, circuits necessary for a write operation, such as a data input buffer and a write amplifier, are omitted from the diagram.

The address buffer ADB receives an address signal AD through an address terminal, and outputs the received signal to the row decoder RDEC and the column decoder CDEC. The row decoder RDEC decodes high-order bits (row address) of the address signal to generate a row decoding signal, and outputs the generated signal to the word driver WD and the plate driver PD. The column decoder CDEC decodes low-order bits (column address) of the address signal to generate a column decoding signal, and outputs the generated signal to the data output buffer BUF and the like.

Figure 6:
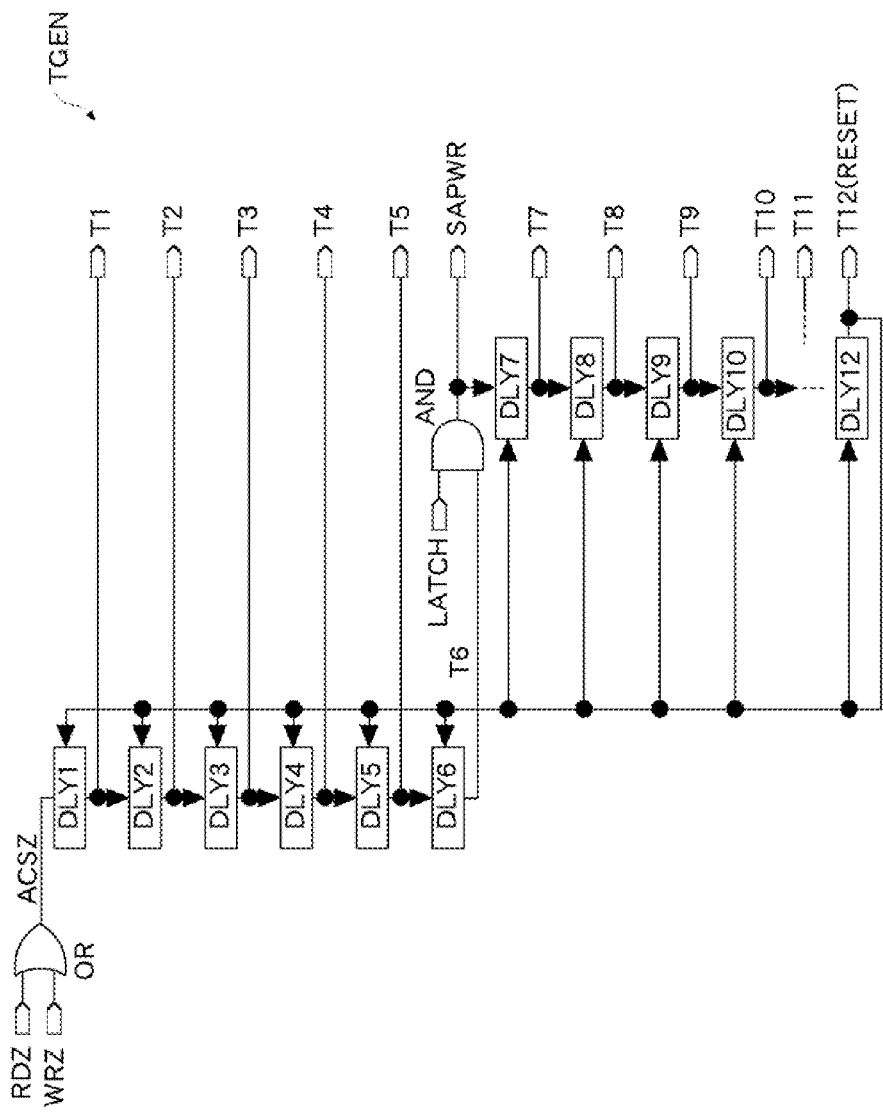
FIG. 6 illustrates a block diagram depicting the details of the timing generator illustrated in FIG. 1.

The command buffer CMDB receives command signals such as a chip select signal/CS and a write enable signal/WE through command terminals, decodes the received signals and outputs a read signal RDZ and a write signal WRZ to the timing generator TGEN. The timing generator TGEN receives the read signal RDZ or the write signal WRZ, and a latch signal LATCH (a detection signal). The timing generator TGEN sequentially outputs timing signals T1-T5, a sense amplifier power signal SAPWR and timing signals T7-T12 for operating the plate driver PD, the word driver WD, the data output buffer BUF, a pre-sense amplifiers PSA and a sense amplifier SA and the like. Details of the timing generator TGEN is illustrated in FIG. 6.

The plate driver PD selects a predetermined plate line PL in response to the timing signal from the timing generator TGEN and the row decoding signal from the row decoder RDEC. The selected plate line PL changes from low level to high level for a predetermined period. The word driver WD selects a predetermined word line WL in response to the timing signal from the timing generator TGEN and the row decoding signal from the row decoder RDEC. The selected word line WL changes from low level to high level for a predetermined period.

Figure 3:
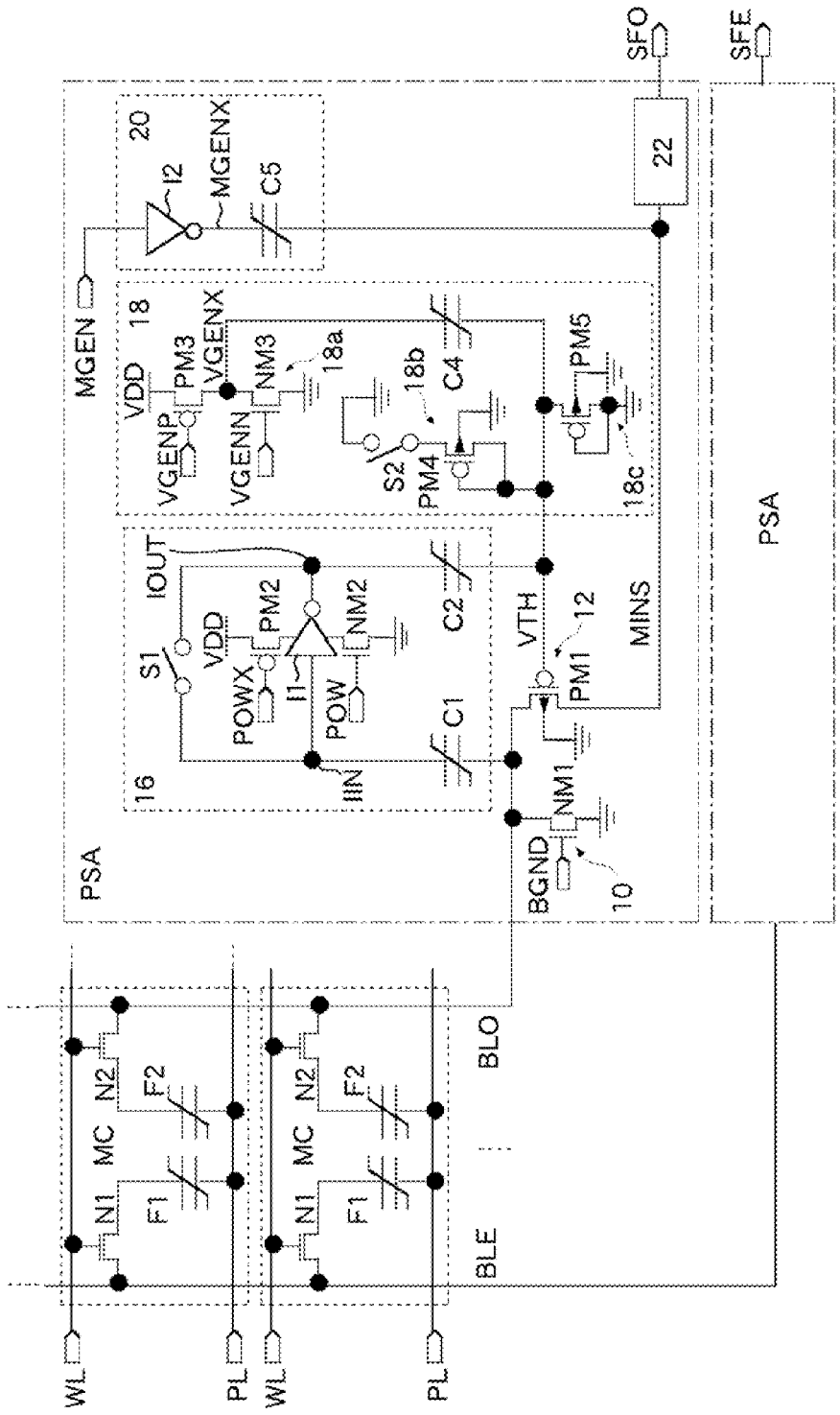
FIG. 3 illustrates a circuit diagram depicting the details of the pre-sense amplifiers illustrated in FIG. 1.

The memory core CORE has a memory cell array ARY, memory cells MC which are coupled complementary bit lines BLE, BLO, pre-sense amplifiers PSA (bit line GND sense circuits) which are coupled to each of the bit line pairs BLE, BLO, and sense amplifiers SA which receive the output signals SFE, SFO from respective pairs of the pre-sense amplifiers PSA corresponding to the bit line pairs BLE and BLO. Each pre-sense amplifier PSA differentially amplifies voltage amplitude of data read from the memory cell MC through the bit line BLE (or BLO). Details of the pre-sense amplifiers PSA is illustrated in FIG. 3.

The sense amplifiers SA operate while the sense amplifier power signal SAPWR (sense amplifier activation signal) is at high level and latch logics of complementary data amplified by the pre-sense amplifiers PSA (determination of logics of data). Each sense amplifier SA outputs output signals SAOUT, SAOUTX indicating the latched logics of complementary data to the data output buffer BUF. The data output buffer BUF selects, for example, 16 bits from a plurality of bits of read data (complementary data) read from the memory core CORE according to the column decoding signal, and outputs the selected read data to a data input/output terminal I/O. The data input/output terminal I/O is formed of 16 bits for example.

Figure 5:
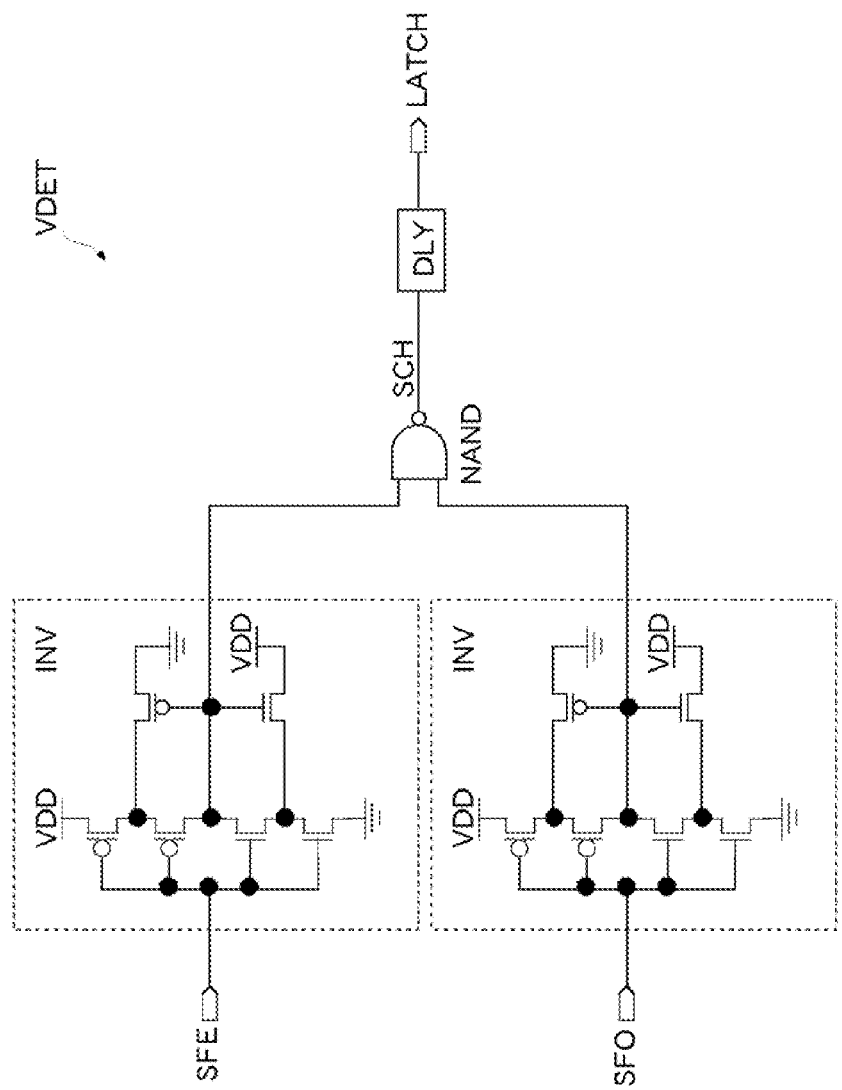
FIG. 5 illustrates a circuit diagram depicting the details of the voltage detection circuit illustrated in FIG. 1.

The voltage detection circuit VDET has a pair of inverters INV, a NAND gate and a delay circuit DLY. In addition, when propagation delay times of the inverters INV and the NAND gate are relatively long, it is possible that the delay circuit DLY is not formed. Each inverter INV is of schmitt trigger type coupled to the output of a pre-sense amplifier PSA. The NAND gate changes an output signal SCH to high level when the output of one of the inverters INV changes to low level. The delay circuit DLY delays the output signal SCH, and outputs it as the detection signal LATCH having the same logic as the output signal SCH. Accordingly, the voltage detection circuit VDET outputs the detection signal LATCH when the amount of charges read to one of the pair of bit lines BLE, BLO reaches a predetermined amount when the memory cells MC are accessed. Details of the voltage detection circuit VDET are illustrated in FIG. 5.

Figure 8:
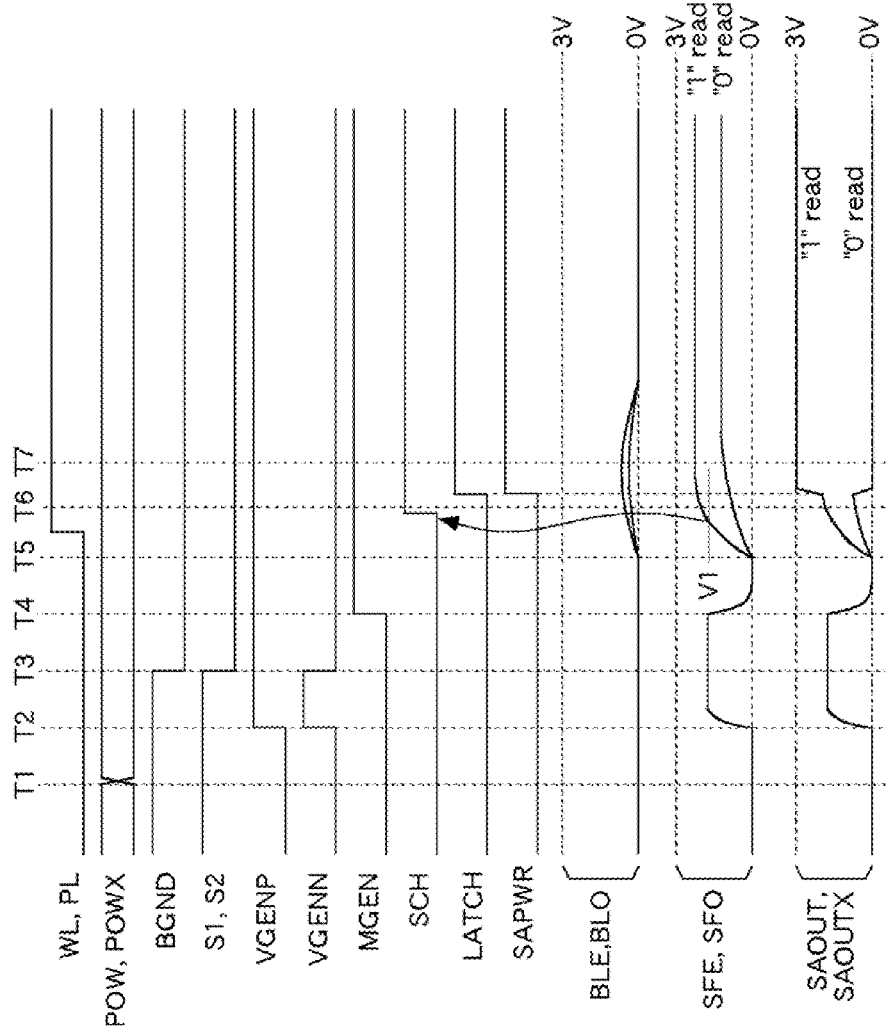
FIG. 8 illustrates a waveform chart depicting another example of the operation of the pre-sense amplifier in FIG. 3 and the sense amplifier in FIG. 4.

The inverter pair INV of the voltage detection circuit VDET is coupled to, for example, the pre-sense amplifier pair PSA corresponding to the pair of bit lines BLE, BLO which are farthest from the plate driver PD. In the pair of bit lines BLE, BLO which are farthest from the plate driver PD, the timing to read charges from the memory cells MC is slowest. Accordingly, for example as illustrated in FIG. 8, which will be described later, when the sense amplifier power signal SAPWR is generated in synchronization with the detection signal LATCH, the sense amplifier SA can be operated to perform amplification after the voltage difference between the output signals SFE, SFO from all the pre-sense amplifiers PSA surely becomes large.

Incidentally, the inverter pair INV of the voltage detection circuit VDET may be coupled to the pre-sense amplifier pair PSA corresponding to the bit line pair BLE, BLO at the center (middle in a left and right direction of the drawing) of the memory cell array ARY. Alternatively, the inverter pair INV may be arranged corresponding to all the pres-sense amplifier pairs PSA. In such an arrangement, an OR circuit of negative logic receiving outputs of all the inverters INV is formed in place of the NAND gate.

Figure 2:
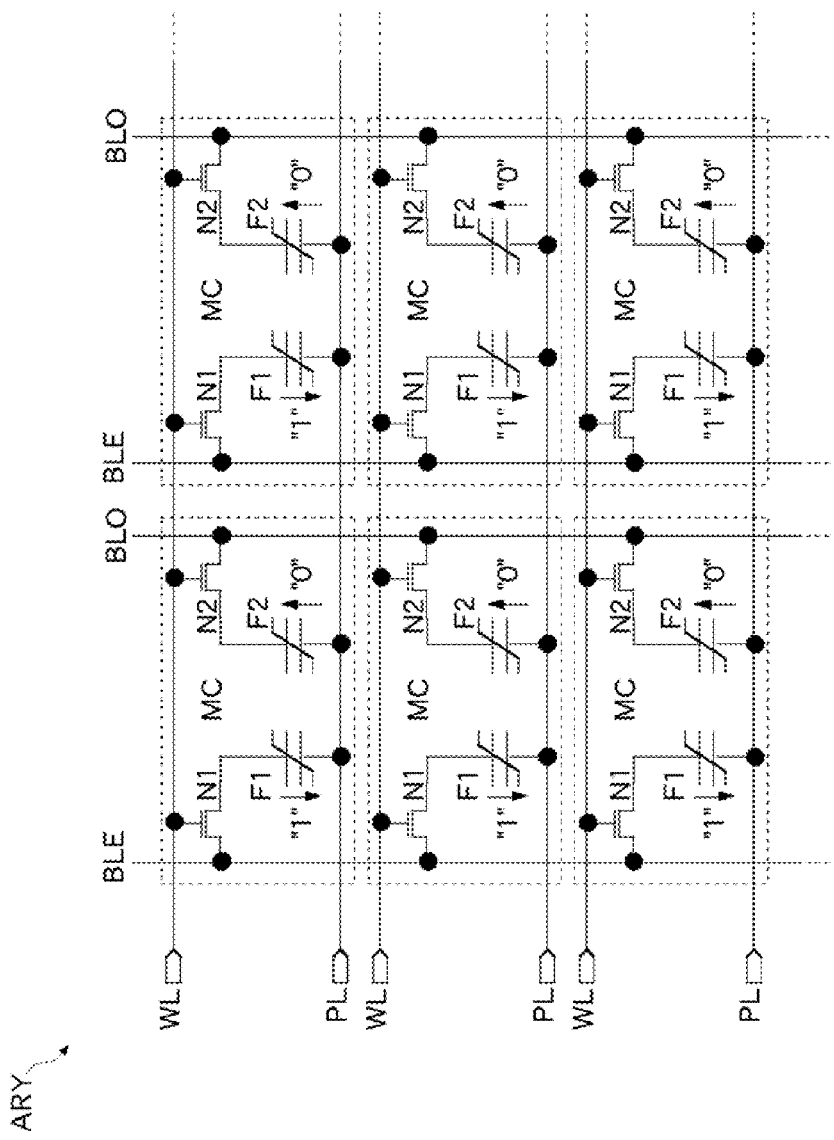
FIG. 2 illustrates a circuit diagram depicting the details of the memory cells illustrated in FIG. 1.

FIG. 2 illustrates details of the memory cells MC illustrated in FIG. 1. Each memory cell MC has an access transistor pair N1, N2 formed of nMOS transistors and a ferroelectric capacitor pair F1, F2. The ferroelectric capacitor F1 has one end coupled to a bit line BLE via the access transistor N1, and the other end coupled to a plate line PL. The ferroelectric capacitor F2 has one end coupled to a bit line BLO via the transfer transistor N2 and the other end coupled to the plate line PL. The gates of the access transistors N1, N2 are coupled to a common word line WL. In the diagram, arrows given to the ferroelectric capacitors F1, F2 each represent a polarization state. An upward arrow is a state of storing "logic 0". A downward arrow is a state of storing "logic 1". The ferroelectric capacitors F1, F2 have different capacitance values corresponding to logics of stored data. That is, the ferroelectric capacitors F1, F2 are capable of storing electric charges corresponding to logics of data.

In general, the memory cells MC in FIG. 2 are referred to as 2T2C type. In a 2T2C type memory cell, data of inverted logics from each other are written in the pair of ferroelectric capacitors F1, F2. The sense amplifier SA illustrated in FIG. 1 differentially amplifies voltages which are read respectively to the complementary bit lines BLE, BLO and amplified by the pre-sense amplifier PSA. Therefore, what is called a reference memory cell is not necessary.

FIG. 3 illustrates details of the pre-sense amplifiers PSA illustrated in FIG. 1. Each pre-sense amplifier PSA has a bit line initializing circuit 10, a charge transferring circuit 12, an inverter amplifier 16, a threshold voltage generator 18, a negative voltage generator 20, and a level shifter 22. The pre-sense amplifier PSA realizes the bit line GND sensing technique.

The bit line initializing circuit 10 is made of an nMOS transistor NM1 receiving a control signal BGND through a gate and having a source coupled to a ground line and a drain coupled to a bit line BL (BLE or BLO). The charge transferring circuit 12 is made of a pMOS transistor PM1 having a gate (control terminal) coupled to an output node VTH of the threshold voltage generator 18, a source coupled to the bit line BL, and a drain coupled to an output node MINS of the negative voltage generator 20.

The inverter amplifier 16 has a CMOS inverter I1 (feedback inverter), a switch S1 coupling an output terminal IOUT of the CMOS inverter I1 to an input terminal IIN thereof, a capacitor C1 arranged between the input terminal IIN of the CMOS inverter I1 and the bit line BL, and a capacitor C2 arranged between the output terminal IOUT of the CMOS inverter I1 and the gate (control terminal) of the charge transferring circuit 12. The source of a pMOS transistor (not illustrated) of the CMOS inverter I1 is coupled to a power supply line VDD via a pMOS transistor PM2 (switch circuit) receiving a power control signal POWX through a gate. The source of an nMOS transistor (not illustrated) of the CMOS inverter I1 is coupled to the ground line via an nMOS transistor NM2 (switch circuit) receiving a power control signal POW through a gate.

To turn on the transistors PM2, NM2 for activating the CMOS inverter I1, the power control signals POWX, POW change respectively to low level and high level in response to the start of a reading operation. Similarly, the switch S1 is turned off when the reading operation is started. The capacitors C1, C2 are each made of, for example, a ferroelectric capacitor. To transfer the charge read to the bit line BLE or BLO to the capacitor C5 of the negative voltage generator 20, the inverter amplifier 16 controls the charge transferability of the charge transferring circuit 12 according to a change in voltage of the bit line BLE or BLO due to the read charge.

The threshold voltage generator 18 has a voltage generator 18a generating high level (power supply voltage VDD) or low level (ground voltage) at a node VGENX, a capacitor C4 coupled between the node VGENX and a node VTH, a clamping circuit 18b coupled to the node VTH, a switch S2 coupling the clamping circuit 18b to the ground line, and a clamping circuit 18c coupling the node VTH to the ground line. The voltage generator 18a has a pMOS transistor PM3 and an nMOS transistor NM3 which are coupled in series between the power supply line VDD and the ground line. The gates of the pMOS transistor PM3 and the nMOS transistor NM3 respectively receive voltage control signals VGENP, VGENN.

The clamping circuit 18b is made of a pMOS transistor PM4 having a source coupled to the ground line via the switch S2, and a gate and a drain coupled to the node VTH. The capacitor C4 is made of, for example, a ferroelectric capacitor. The clamping circuit 18c is made of a pMOS transistor PM5 having a source coupled to the node VTH and a gate, a drain, and a substrate coupled to the ground line.

The negative voltage generator 20 has a CMOS inverter I2 receiving a negative voltage control signal MGEN and an output coupled to a node MGENX, and a capacitor C5 arranged between the node MGENX and the node MINS. The capacitor C5 is made of, for example, a ferroelectric capacitor. The negative voltage generator 20 stores a charge read to the bit line BLE or BLO from the memory cells MC during a read operation, and generates a read voltage according to the stored charge.

The level shifter 22 has a capacitor (not illustrated) for converting the negative voltage generated in the node MINS into a positive voltage. The level shifter 22 corresponding to the pre-sense amplifier PSA to which the bit line BLE is coupled outputs the output signal SFE. The level shifter 22 corresponding to the pre-sense amplifier PSA to which the bit line BLO is coupled outputs the output signal SFO.

Figure 4:
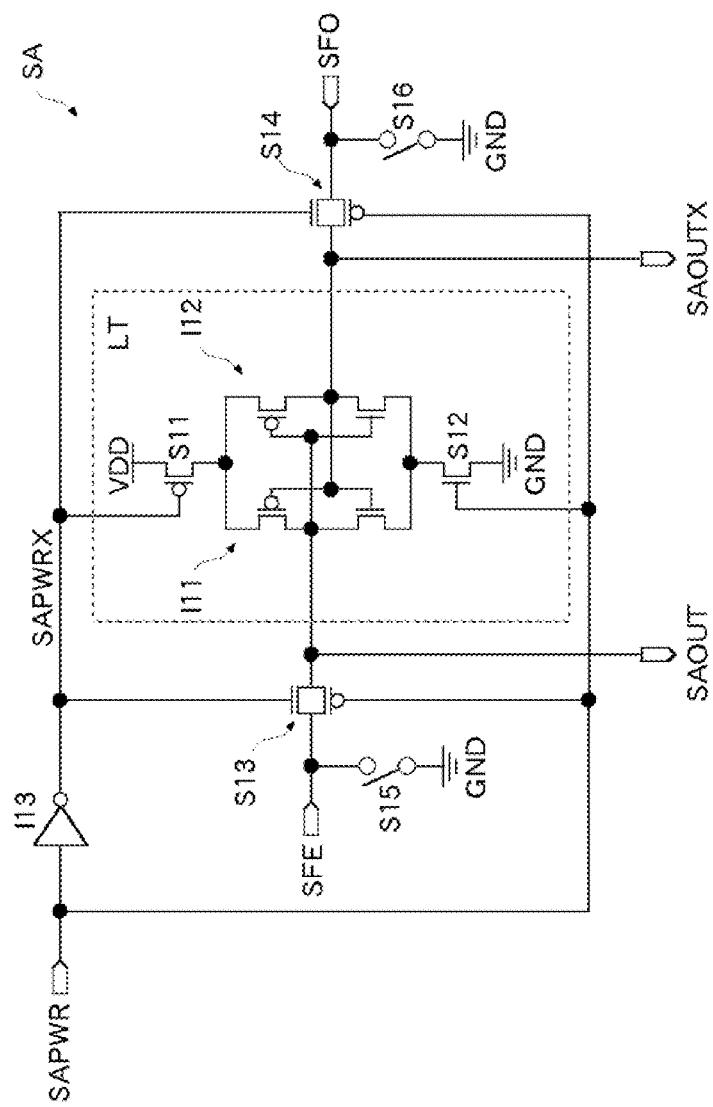
FIG. 4 illustrates a circuit diagram depicting the details of the sense amplifiers illustrated in FIG. 1.

FIG. 4 illustrates details of the sense amplifier SA illustrated in FIG. 1. The sense amplifier SA is made up of a latch LT including a pair of CMOS inverters I11, I12 and switches S11, S12, a CMOS inverter I13, and switches S13, S14, S15, S16. Complementary input/output nodes SAOUT, SAOUTX of the latch LT are outputs of the sense amplifier SA. The CMOS inverter I13 inverts the sense amplifier power signal SAPWR and outputs it as a sense amplifier power signal SAPWRX.

The switch S11 (pMOS transistor) turns on while the sense amplifier power signal SAPWR is at high level, so as to couple the CMOS inverters I11, I12 to the power supply line VDD. The switch S12 (nMOS transistor) turns on while the sense amplifier power signal SAPWR is at high level, so as to couple the CMOS inverters I11, I12 to the ground line GND. The switches S13, S14 turn on while the sense amplifier power signal SAPWR is at low level, so as to transmit the output signals SFE, SFO of the pre-sense amplifier PSA to the latch LT. The switches S15, S16 turn off while the sense amplifier SA is operating, and turn on while the sense amplifier SA is not operating.

The sense amplifier SA is inactivated and stops to operate while the sense amplifier power signal SAPWR is at low level, and is activated in synchronization with a change of the sense amplifier power signal SAPWR to high level and amplifies the voltage difference between the nodes SAOUT, SAOUTX. By this amplification, the logical values of data read from the memory cells MC are latched to the latch LT. Further, the latched complementary data (logical values) are output as the output signals SAOUT, SAOUTX.

FIG. 5 illustrates details of the voltage detection circuit VDET illustrated in FIG. 1. Each inverter INV of the voltage detection circuit VDET is a publicly known schmitt trigger type inverter.

FIG. 6 illustrates details of the timing generator TGEN illustrated in FIG. 1. The timing generator TGEN has a plurality of cascade-coupled delay circuits DLY1-DLY12, an OR circuit, and an AND circuit. The OR circuit activates an access signal ACSZ to high level in synchronization with activation of the read signal RDZ or the write signal WRZ. The delay circuits DLY1-6 sequentially delay a rising edge of the access signal ACSZ and outputs it as timing signals T1-T6. The AND circuit activates the sense amplifier power signal SAPWR to high level when the detection signal LATCH and the timing signal T6 are both at high level. That is, also when the timing signal T6 is output earlier than the detection signal LATCH, the AND circuit operates as a mask circuit to mask the output of the sense amplifier power signal SAPWR until the detection signal LATCH is output.

The delay circuits DLY7-12 sequentially delay a rising edge of the sense amplifier power signal SAPWR, and outputs it as timing signals T7-T12. Specifically, the delay circuit DLY7 in the next stage of the delay circuit DLY6 outputting the timing signal T6 operates upon reception of the sense amplifier power signal SAPWR. The timing signal T12 is supplied as a reset signal RESET to the delay circuits DLY1-12. The delay circuits DLY1-12 are reset upon reception of high level of the reset signal RESET, and changes the timing signals T1-12 to low level. Incidentally, other than those illustrated, the timing generator TGEN has a circuit generating a control signal for the pre-sense amplifier PSA.

Figure 7:
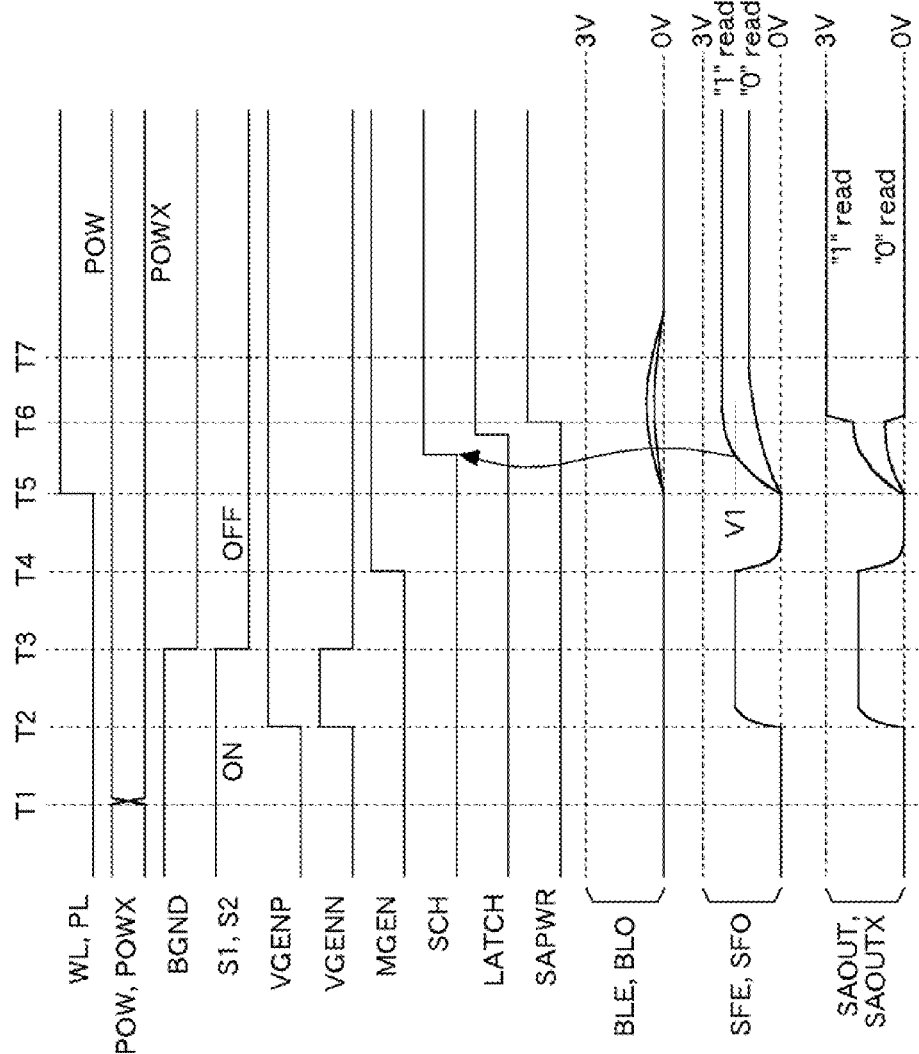
FIG. 7 illustrates a waveform chart depicting an example of an operation of the pre-sense amplifier in FIG. 3 and the sense amplifier in FIG. 4.

FIG. 7 illustrates operations of the pre-sense amplifier PSA in FIG. 3 and the sense amplifier SA in FIG. 4. This example illustrates a situation that the threshold voltages of the transistors forming the ferroelectric memory FM are approximately equal to a standard value. Incidentally, the operation of the pre-sense amplifier for realizing the bit line GND sensing technique is publicly known, and thus only the timing of an input signal to the pre-sense amplifier PSA and the timing of an output signal from the pre-sense amplifier PSA are illustrated in FIG. 7. Times T1-T7 in FIG. 7 indicate times when the timing signals T1-T7 change to high level.

First, in an initial state (standby state) before an access request is supplied, the control signal BGND is set to high level, and thus the nMOS transistor NM1 (bit line initializing circuit) turns on and the voltage of the bit line BL (BLE or BLO) is initialized to the ground voltage. The power control signals POW, POWX are retained at low level and high level respectively, and the feedback inverter I1 is off. The switches S1, S2 are on. The control signals controlling the operations of the switches S1, S2, and the voltage control signals VGENP, VGENN, the negative voltage control signal MGEN, the control signal BGND, and the power control signals POW, POWX are generated by the timing generator TGEN illustrated in FIG. 1.

At time T1, the power control signals POW, POWX change to high level and low level respectively, and the feedback inverter I1 is activated. Since the switch S1 is on, the input voltage IIN and the output voltage IOUT of the feedback inverter I1 are approximately VDD/2.

At time T2, the voltage control signals VGENP, VGENN change to high level, and the voltage (not illustrated) of the node VTH is, after decreasing temporarily, initialized to the threshold voltage (for example, −0.6V) of the pMOS transistor PM4 (clamping circuit). The threshold voltages of the pMOS transistors PM1, PM4 are designed equal to each other. Accordingly, when the voltage of the node VTH decreases temporarily, the pMOS transistor PM1 turns on, and the voltage of the node MINS is initialized to the voltage (ground voltage) of the bit line BL. The output nodes SFE, SFO of the pre-sense amplifier pair PSA rise according to the change in voltage of the node MINS. Incidentally, as illustrated in FIG. 4, the output nodes SAOUT, SAOUTX of the sense amplifier SA are coupled to the nodes SFE, SFO until the sense amplifier power signal SAPWR is activated. Accordingly, the voltages of the nodes SAOUT, SAOUTX change similarly to the voltages of the nodes SFE, SFO until the sense amplifier power signal SAPWR is activated.

At time T3, the voltage control signal VGENN changes to low level and the node VGENX in FIG. 1 turns to a floating state. At the same time, the switches S1, S2 are turned off. By turning off the switch S2, clamping of the node VTH by the pMOS transistor PM4 is released. By turning off the switch SI, the short circuit of the input and the output of the feedback inverter I1 is released. Since the voltage of the input of the feedback inverter I1 is approximately VDD/2, the feedback inverter I1 operates as an inverse amplifier having high gain.

On the other hand, the control signal BGND also changes to low level, and the bit line BL turns to a floating state. Due to the operation as above, after time T3, when the voltage of the bit line BL changes, the input voltage IIN of the feedback inverter I1 changes due to capacitive coupling of the capacitor C1. The feedback inverter I1 amplifies the change of the input voltage IIN, and changes the output voltage IOUT to the reverse direction. Due to capacitive coupling of the capacitor C2, the voltage of the node VTH changes accompanying the change of the output voltage IOUT.

At time T4, the negative voltage control signal MGEN changes to high level and the voltage of the node MGENX in FIG. 1 changes from high level to low level. The voltage of the node MINS in FIG. 1 decreases accompanying the decrease of the voltage of the node MGENX due to capacitive coupling of the capacitor C5. The output nodes SFE, SFO of the pre-sense amplifier pair PSA fall to the ground voltage according to the change in voltage of the node MINS.

At time T5, the voltages of the word lines WL and the plate lines PL change from the ground voltage to the power supply voltage VDD (3V in this example). By rising of the word lines WL, the access transistors N1 of the memory cells MC turn on, applying positive voltages to the ferroelectric capacitor pair F1, F2 of the memory cells MC. The polarity of the voltage applied to the ferroelectric capacitor F1 (or F2) storing data "1" is opposite to that when writing, and thus reverse polarization occurs and a large reverse charge is read to the bit lines BL (BLE or BLO). The polarity of the voltage applied to the ferroelectric capacitor F2 (or F1) storing data "0" is the same as that when writing, and thus reverse polarization does not occur and a relatively small charge is read to the bit line BL (BLO or BLE).

At this time, the voltages of the bit lines BLE, BLO both attempt to rise. However, when the voltage of the bit line BL increases slightly, the input voltage of the feedback inverter I1 increases due to the capacitive coupling of the capacitor C1. Due to the inverse amplifying operation of the feedback inverter I1 and the capacitive coupling of the capacitor C2, the voltage of the node VTH decreases, and the gate-to-source voltage (absolute value) of the pMOS transistor PM1 becomes large. Accordingly, a drain current is generated in the pMOS transistor PM1, and the charge read to the bit line BL is transferred from the bit line BL to the node MINS. Therefore, rise of the voltage of the bit line BL is suppressed, and it is held to approximately 0 V (ground voltage). In this manner, the feedback inverter I1 operates as a control circuit adjusting the charge transferability of the charge transferring circuit 12.

The capacitor C5 is charged by the charge transferred to the node MINS, and thus the voltage (read voltage) of the node MINS rises. At this time, the voltage of the node MINS corresponding to the ferroelectric capacitor F1 (or F2) storing data "1" rises higher than the voltage of the node MINS corresponding to the ferroelectric capacitor F2 (or F1) storing data "0". The outputs SFE, SFO of the pre-sense amplifier pair PSA rise according to the change in voltage of the node MINS. At this time, the voltage of the output SFE (or SFO) corresponding to the ferroelectric capacitor F1 (or F2) storing data "1" rises earlier than the voltages of the outputs SFO, SFE corresponding to the ferroelectric capacitor F2 (or F1) storing data "0".

The voltage detection circuit VDET illustrated in FIG. 1 changes the output signal SCH to high level when the amount of charge read to one of the bit line pair BLE, BLO reaches a predetermined amount and one of the output signals SFE, SFO reaches a first voltage V1. Then the voltage detection circuit VDET changes the detection signal LATCH to high level at a predetermined time later than the output signal SCH. The timing generator TGEN illustrated in FIG. 6 changes the sense amplifier power signal SAPWR to high level in synchronization with the signal that changes to high level later, out of the timing signal T6 and the detection signal LATCH. In this example, the sense amplifier power signal SAPWR is activated in synchronization with the timing signal T6. Then the sense amplifier SA illustrated in FIG. 4 is activated in synchronization with the rising edge of the sense amplifier power signal SAPWR, and amplifies the voltage difference between the output nodes SFE, SFO. That is, the logic of the data amplified by the pre-sense amplifier PSA is determined by the sense amplifier SA.

FIG. 8 illustrates another example of the operations of the pre-sense amplifier PSA in FIG. 3 and the sense amplifier SA in FIG. 4. This example illustrates a situation that the threshold voltages of the transistors forming the ferroelectric memory FM are low. When the operation temperature of the ferroelectric memory FM is low, or when the operating voltage of the ferroelectric memory FM is high, waveforms similar to those in FIG. 8 are exhibited. Detailed descriptions of the same operations as in FIG. 7 are omitted.

Since the threshold voltages of the transistors are low, output times of the timing signals T1-T7 become earlier as compared to FIG. 7. The time interval between time T5 and time T6 becomes short. Thus, at time T6 the voltage difference between the outputs SFE, SFO of the pre-sense amplifier PSA is small, which is insufficient to be amplified in the sense amplifier SA. In the present embodiments, with the AND circuit illustrated in FIG. 6, the sense amplifier power signal SAPWR is activated in synchronization with a later one of the detection signal LATCH and the timing signal T6. In this example, the sense amplifier power signal SAPWR is activated in synchronization with the detection signal LATCH that is output later than time T6. Therefore, when the threshold voltages of the transistors are low, the latch operation (amplification operation) of the sense amplifier SA can be started when the voltage difference between the output nodes SFE, SFO becomes sufficiently large. As a result, the read margin of the sense amplifier SA can be made large, and the data read from the memory cells MC can be latched correctly in the sense amplifier SA.

Figure 9:
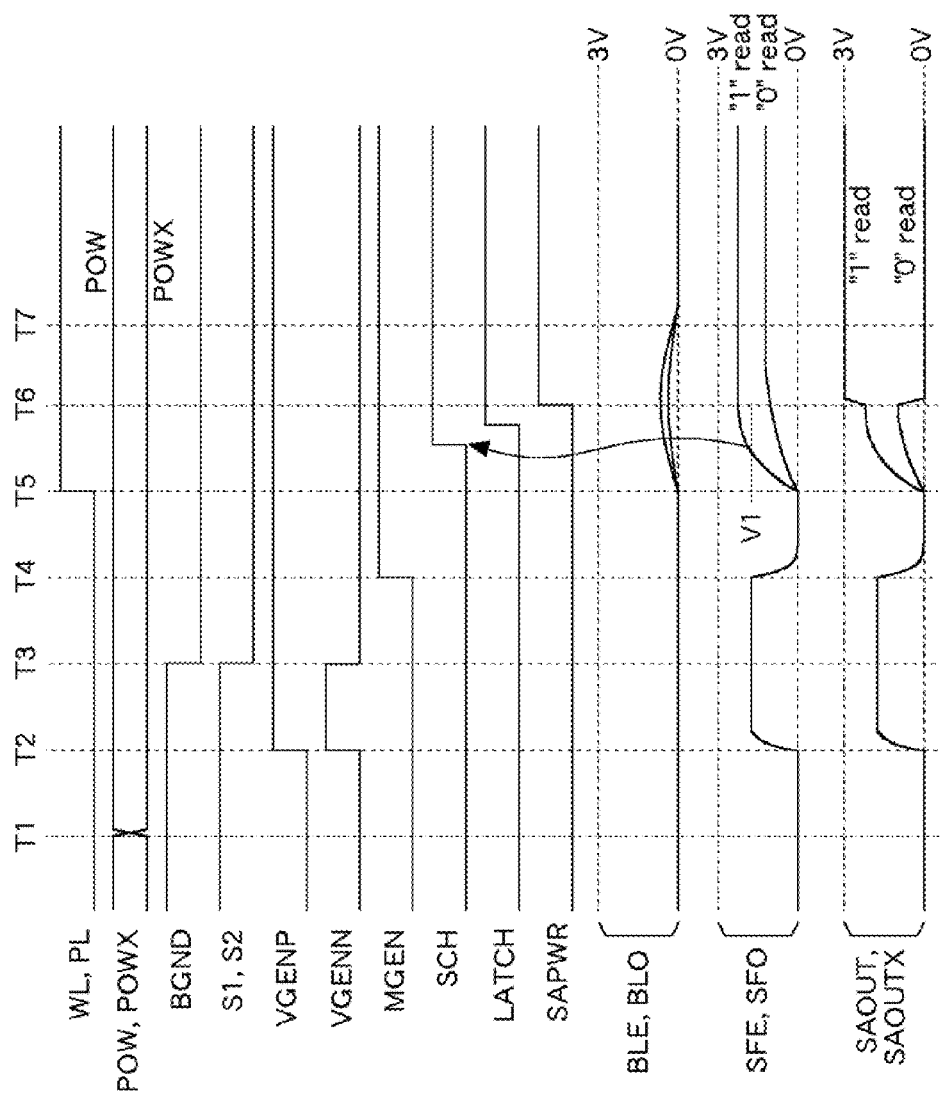
FIG. 9 illustrates a waveform chart depicting another example of the operation of the pre-sense amplifier in FIG. 3 and the sense amplifier in FIG. 4.

FIG. 9 illustrates another example of the operations of the pre-sense amplifier PSA in FIG. 3 and the sense amplifier SA in FIG. 4. This example illustrates a situation that the threshold voltages of the transistors forming the ferroelectric memory FM are high. When the operation temperature of the ferroelectric memory FM is high, or when the operating voltage of the ferroelectric memory FM is low, waveforms similar to those in FIG. 9 are exhibited. Detailed descriptions of the same operations as in FIG. 7 are omitted.

Since the threshold voltages of the transistors are high, output times of the timing signals T1-T7 become later as compared to FIG. 7. The time interval between time T5 and time T6 becomes long. Thus, at time T6 the voltage difference between the outputs SFE, SFO of the pre-sense amplifier PSA is sufficiently large, which is sufficient to be amplified in the sense amplifier SA. In this example, the sense amplifier power signal SAPWR is activated in synchronization with time T6 that is later than the detection signal LATCH. Therefore, the latch operation of the sense amplifier SA can be started when the voltage difference between the output nodes SFE, SFO becomes sufficiently large, similarly to FIG. 7.

Figure 10:
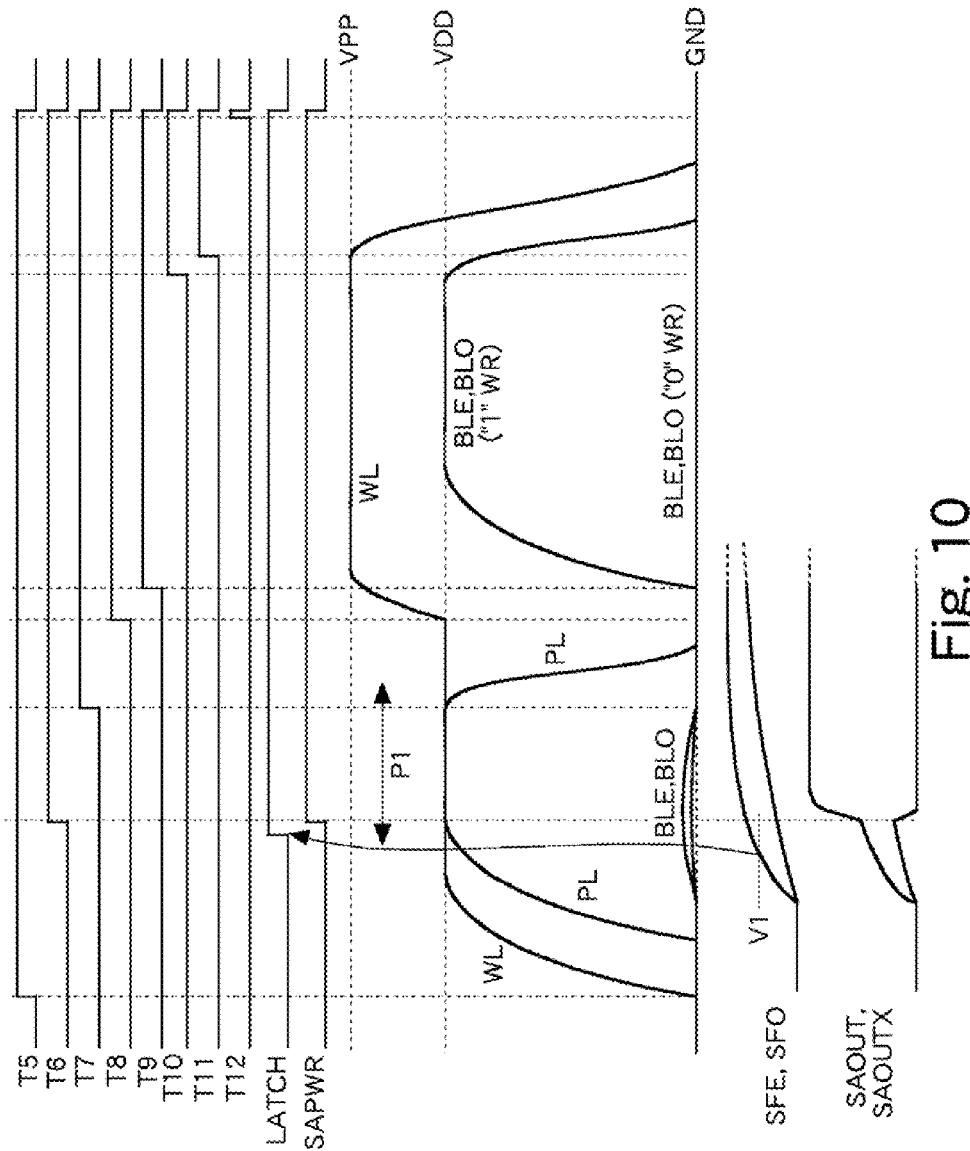
FIG. 10 illustrates a waveform chart depicting an access operation of the ferroelectric memory illustrated in FIG. 1.

FIG. 10 illustrates an access operation (read operation or write operation) of the ferroelectric memory FM illustrated in FIG. 1. The operation illustrated in FIG. 10 is the same for both the read operation and the write operation. This example illustrates a situation that the threshold voltages of the transistors forming the ferroelectric memory FM are almost equal to the standard value.

The word driver WD illustrated in FIG. 1 changes the word lines WL from low level (GND) to high level (VDD) in synchronization with the timing signal T5. The plate driver PL changes the plate lines PL from low level (GND) to high level (VDD) in synchronization with timing of slightly delaying the timing signal T5. By rising of the plate lines PL, charges are read from the ferroelectric capacitor pair F1, F2 to the bit line pair BLE, BLO, and voltages of the output nodes SFE, SFO of the pre-sense amplifier PSA rise. Then similarly to FIG. 7 described above, the detection signal LATCH is output when one of the voltages of the output nodes SFE, SFO reaches the first voltage V1. The sense amplifier SA amplifies the voltage difference between the output nodes SFE, SFO in synchronization with the sense amplifier power signal SAPWR generated in synchronization with the timing signal T6.

The plate driver PD changes the plate lines to low level (GND) in synchronization with the timing signal T7. Here, the high level period P1 of the plate lines PL is set to, for example, 10 ns (minimum value) under worst conditions. By the operation of the pre-sense amplifier PSA, the bit lines BLE, BLO are maintained approximately to the ground voltage GND while the plate lines PL are at high level. Accordingly, data "0" is written to the ferroelectric capacitors F1, F2 during the period P1. In other words, when the ferroelectric capacitors F1, F2 retain data "1", this data is destroyed. By assuring the period P1, data "0" can be written to the ferroelectric capacitor pair F1, F2 securely. That is, the write margin can be improved.

Thereafter, the word driver WD changes the word lines WL to a boost voltage VPP in synchronization with the timing signal T8. For example, the boost voltage is generated by a boost voltage generator formed in the ferroelectric memory FM. When data "1" is written in the ferroelectric capacitor F1 or F2, the bit line BLE or BLO is set to high level (VDD) during the period of the timing signals T9 to T10. When data "0" is written to the ferroelectric capacitor F1 or F2 in the period P1, the bit line BLE or BLO is set to low level (GND) for retaining the data "0". The boost period of the word lines WL is a write period of data "1" to the memory cells MC, and at the same time, it is also a rewrite period of data "1" destroyed in the read period (period P1).

Next, the word lines WL are set to low level (GND) in synchronization with the timing signal T11. Then the timing signals T1-12, the detection signal LATCH, and the sense amplifier power signal SAPWR are inactivated to low level in synchronization with the rising edge of the timing signal T12, thereby completing the access operation.

Figure 11:
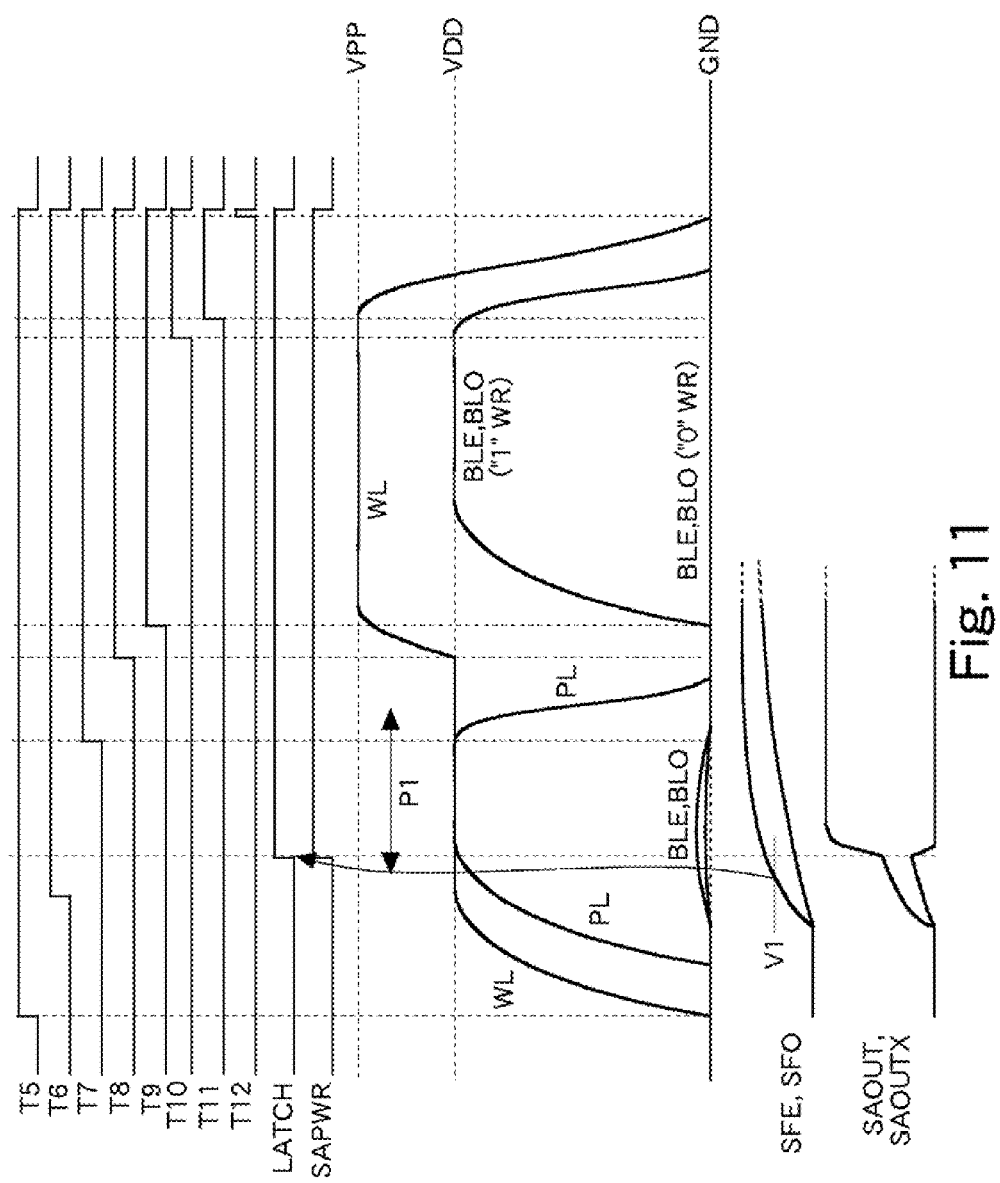
FIG. 11 illustrates a waveform chart depicting another example of the access operation of the ferroelectric memory illustrated in FIG. 1.

FIG. 11 illustrates another example of an access operation of the ferroelectric memory FM illustrated in FIG. 1. This example illustrates a situation that the threshold voltages of the transistors forming the ferroelectric memory FM are low. When the operation temperature of the ferroelectric memory FM is low, or when the operating voltage of the ferroelectric memory FM is high, waveforms similar to those in FIG. 11 are exhibited. Detailed descriptions of the same operations as in FIG. 10 are omitted.

Since the threshold voltages of the transistors are low, the time interval between time T5 and time T6 becomes shorter as compared to FIG. 10. However, as described with FIG. 8, the sense amplifier power signal SAPWR is activated in synchronization with the detection signal LATCH output later than time T6. Therefore, when the threshold voltages of the transistors are low, the latch operation of the sense amplifier SA can be started after the voltage difference between the output nodes SFE, SFO becomes sufficiently large.

The timing signal T7 deciding a falling timing of the plate lines PL is generated in synchronization with the rising edge of the sense amplifier power signal SAPWR. Accordingly, also when the rising edge of the timing signal T6 appears earlier, the high level period P1 of the plate lines PL can be obtained securely, and data "0" can be written reliably to the ferroelectric capacitor pair F1, F2.

Figure 12:
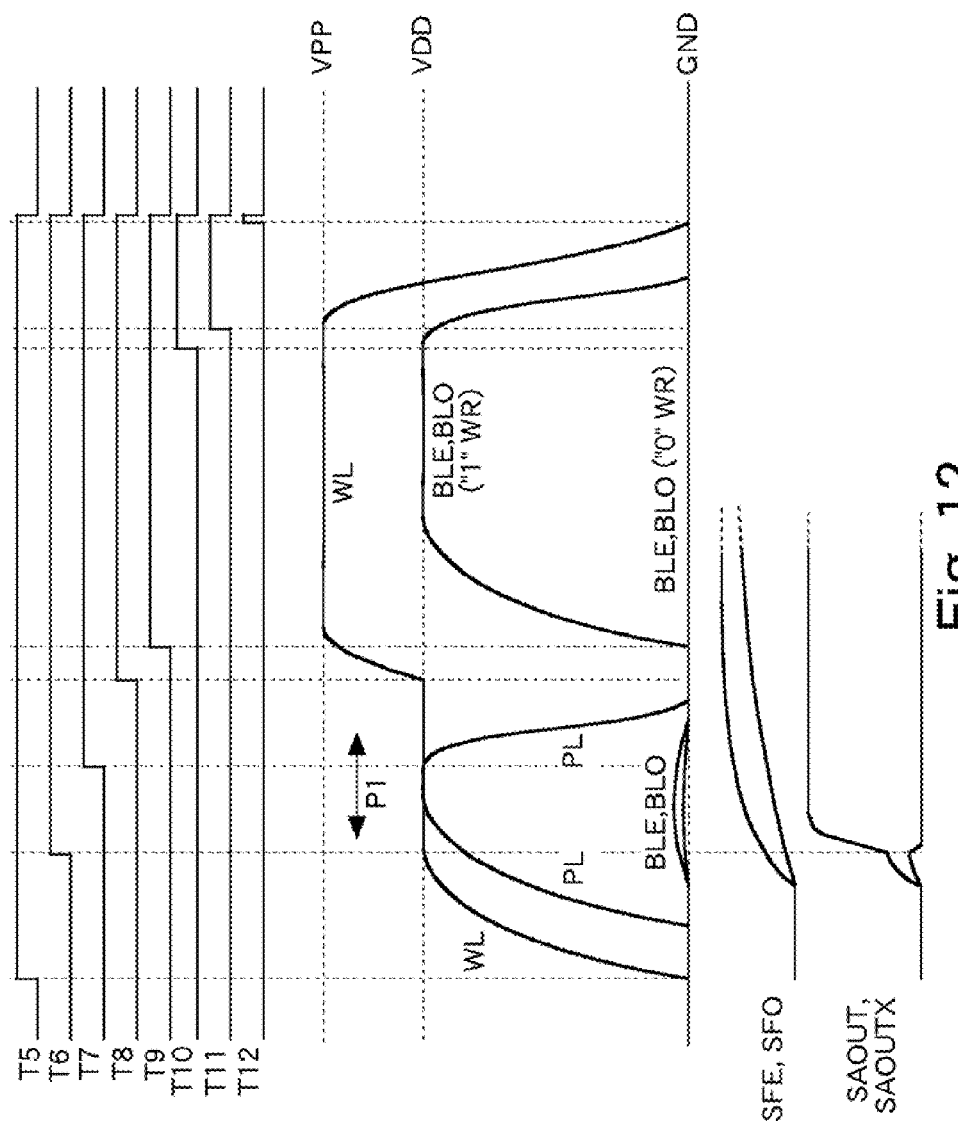
FIG. 12 illustrates a waveform chart depicting an access operation of the ferroelectric memory considered by the inventors.

FIG. 12 illustrates an access operation of the ferroelectric memory FM which is considered by the inventor. This example illustrates a situation that the threshold voltages of the transistors forming the ferroelectric memory FM are low. Detailed descriptions of the same operations as in FIG. 10 are omitted.

In this example, the sense amplifier SA is activated in synchronization with the timing signal T6. Since the threshold voltages of the transistors are low, the timing signal T6 is generated earlier. At time T6, the voltage difference between the outputs SFE, SFO of the pre-sense amplifier PSA is small, which is insufficient for amplification in the sense amplifier SA. That is, the read margin decreases. Furthermore, the time interval between the times T6, T7 becomes short, and thus the high level period P1 of the plate lines PL becomes short. As a result, the write margin for writing data "0" to the ferroelectric capacitor pair F1, F2 decreases. The present embodiments can solve these problems at the same time.

As above, in the first embodiment, the operation of the sense amplifier SA can always be started after the detection signal LATCH is output. Accordingly, for example, when the threshold voltages of the transistors become lower than an expected value, and the output timings of the timing signals T1-T5 become earlier due to a variance of manufacturing conditions of the ferroelectric memory FM, data read from the memory cells MC can be latched correctly in the sense amplifier SA, and malfunctions of the ferroelectric memory FM can be prevented.

Furthermore, the delay circuits DLY7-12 operate upon reception of the sense amplifier power signal SAPWR. Thus, the output timings of the timing signals T7-12 can be shifted according to the operation timing of the sense amplifier SA. That is, after the sense amplifier SA latches data, the operation timing of the circuit operating in synchronization with the timing signals T7-12 can be set according to the latch timing of the sense amplifier SA. Particularly, since the timing (time T7) to inactivate the plate lines to low level can be set according to the sense amplifier power signal SAPWR, the high level period P1 of the plate lines PL can be secured longer than a predetermined period. As a result, the write margin of data "0" can be secured when the output timing of the timing signal T6 is early.

By applying the present embodiments to the ferroelectric memory FM made of the memory cells MC of 2T2C type retaining complementary logical values, the detection signal LATCH can be generated using real memory cells MC from/to which data are read/written. It is not necessary to provide special memory cells for generating the detection signal LATCH, and thus the circuit scale of the ferroelectric memory FM can be reduced.

Figure 13:
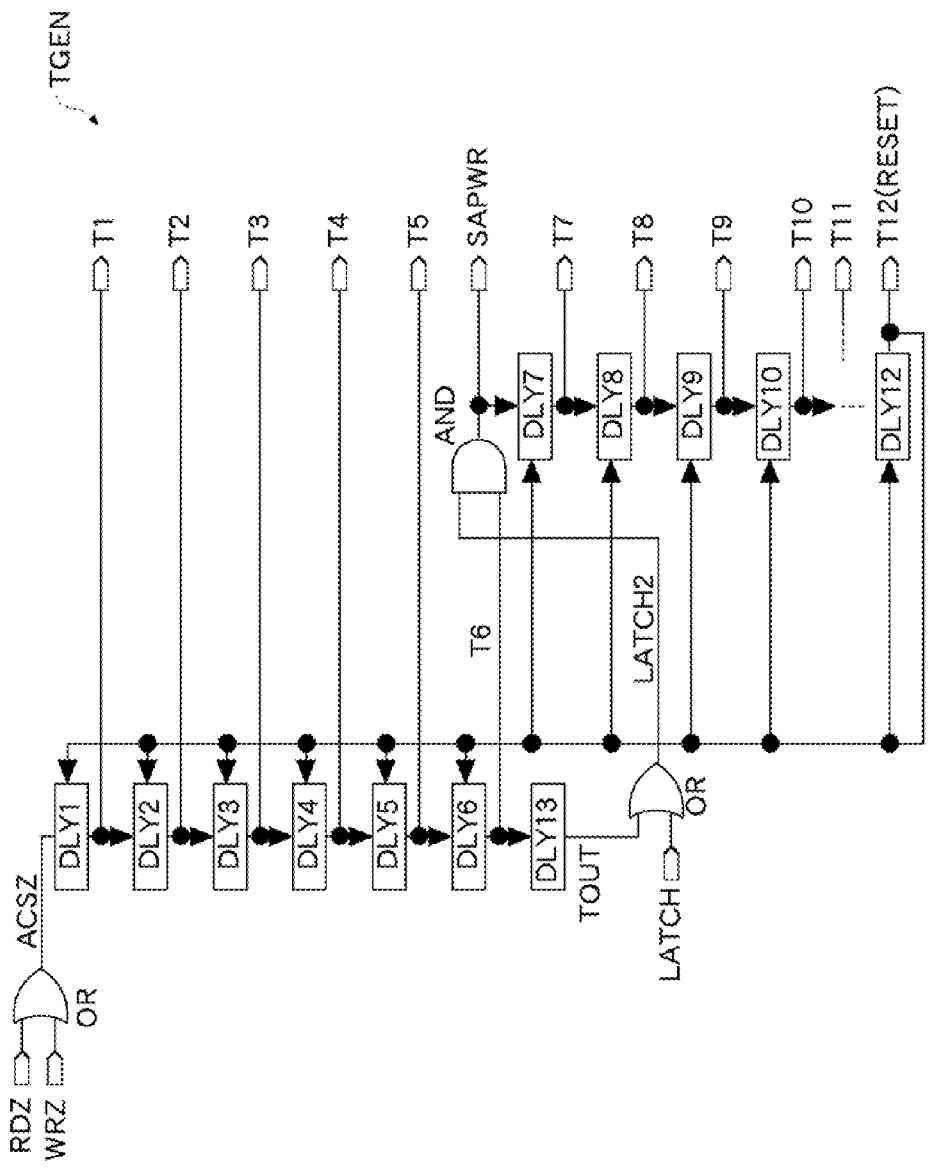
FIG. 13 illustrates a block diagram depicting a timing generator according to a second embodiment of the present invention.

FIG. 13 illustrates a timing generator TGEN of a second embodiment of the present invention. The same elements as those described in the first embodiment are given the same reference numerals, and detailed descriptions thereof are omitted. In this embodiment, a delay circuit DLY 13 and an OR circuit receiving the detection signal LATCH are added to the timing generator TGEN of the first embodiment. The mask circuit is made up of the OR circuit receiving the detection signal LATCH and an AND circuit. The other structure is the same as in the first embodiment. That is, the semiconductor memory is the ferroelectric memory FM.

The delay circuit DLY 13 delays the timing signal T6 and outputs it as a time-out signal TOUT. The OR circuit outputs the time-out signal TOUT or the detection signal LATCH as a detection signal LATCH2 to the AND circuit. Thus, even when the detection signal LATCH is not output, the detection signal LATCH2 is output in synchronization with the time-out signal TOUT. Then the AND circuit activates the sense amplifier power signal SAPWR in a period during which the timing signal T6 and the detection signal LATCH2 are both at high level. In this manner, the OR circuit operates as a mask release circuit which releases the mask in response to output of the time-out signal TOUT, so as to output the sense amplifier power signal SAPWR even when the detection signal LATCH is not output.

Figure 14:
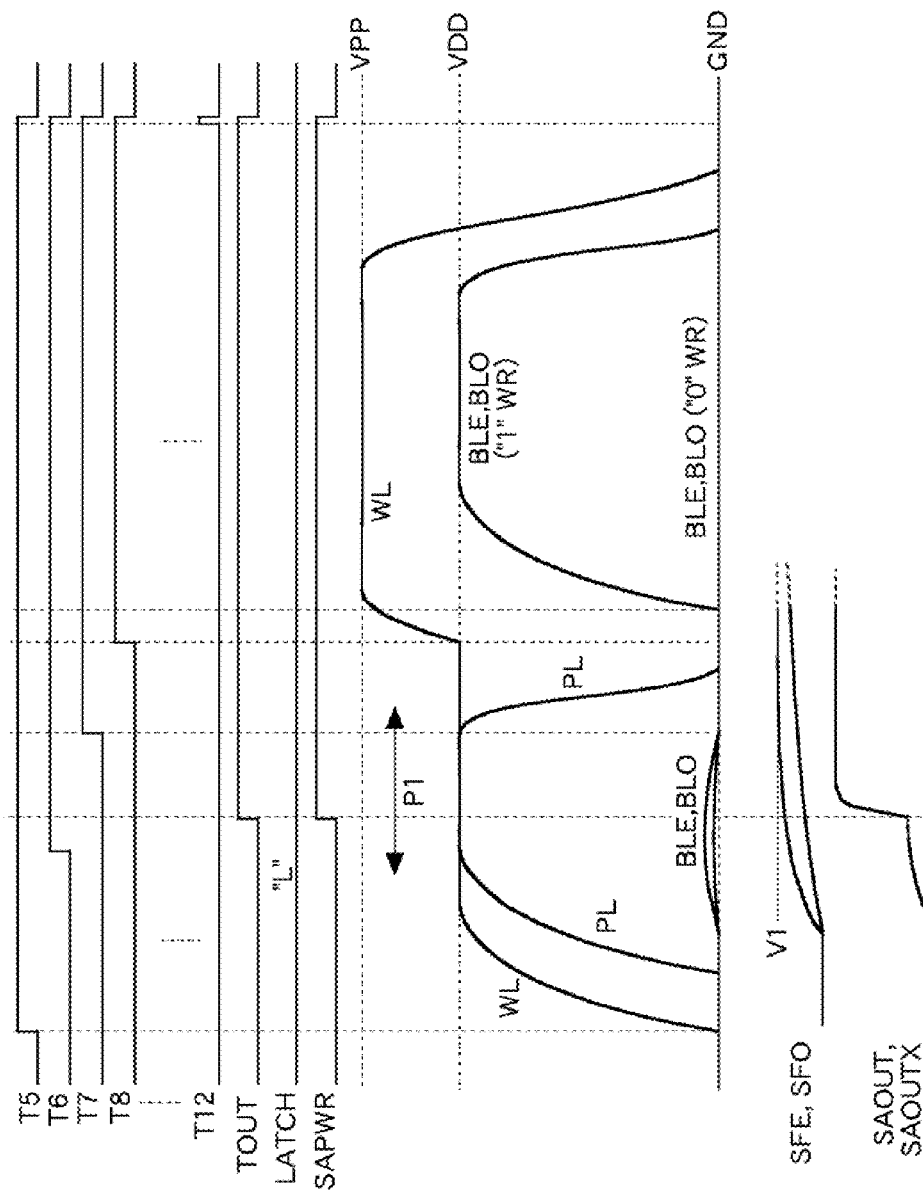
FIG. 14 illustrates a waveform chart depicting an access operation of the ferroelectric memory according to the second embodiment.

FIG. 14 illustrates an access operation of the ferroelectric memory FM in the second embodiment. FIG. 14 illustrates an example in which the ferroelectric capacitors F1, F2 forming the ferroelectric memory FM are formed with a small capacitance value due to a variance of manufacturing conditions. Detailed descriptions of the same operation as in FIG. 10 are omitted.

When capacitance values of the ferroelectric capacitors F1, F2 are small, the amount of charges read to the bit line BLE or BLO from the memory cells MC is small, and sometimes the voltages of the output nodes SFE, SFO of the pre-sense amplifier PSA do not reach the first voltage VI before time T7.

When this happens, the voltage detection circuit VDET cannot change the detection signal LATCH to high level and retains it to low level L. However, the sense amplifier power signal SAPWR is activated in synchronization with a rising edge of the time-out signal TOUT. Accordingly, the sense amplifier SA amplifies the voltage difference between the output nodes SFE, SFO. For example, the time-out signal TOUT changes to high level between time T6 and time T7. That is, the delay time of the delay circuit DLY13 is set shorter than the delay time of the delay circuit DLY7.

As above, also in the second embodiment, the same effect as in the above-described first embodiment can be obtained. Furthermore, in this embodiment, the sense amplifier power signal SAPWR is output in response to the time-out signal TOUT or the detection signal LATCH. Accordingly, for example, even when the capacitance values of the ferroelectric capacitors F1, F2 are small, the sense amplifier power signal SAPWR can be generated securely, and the sense amplifier SA can be operated at predetermined timings reliably. Consequently, data read from the memory cells MC can be latched correctly in the sense amplifier SA, and malfunctions of the ferroelectric memory FM can be prevented.

Figure 15:
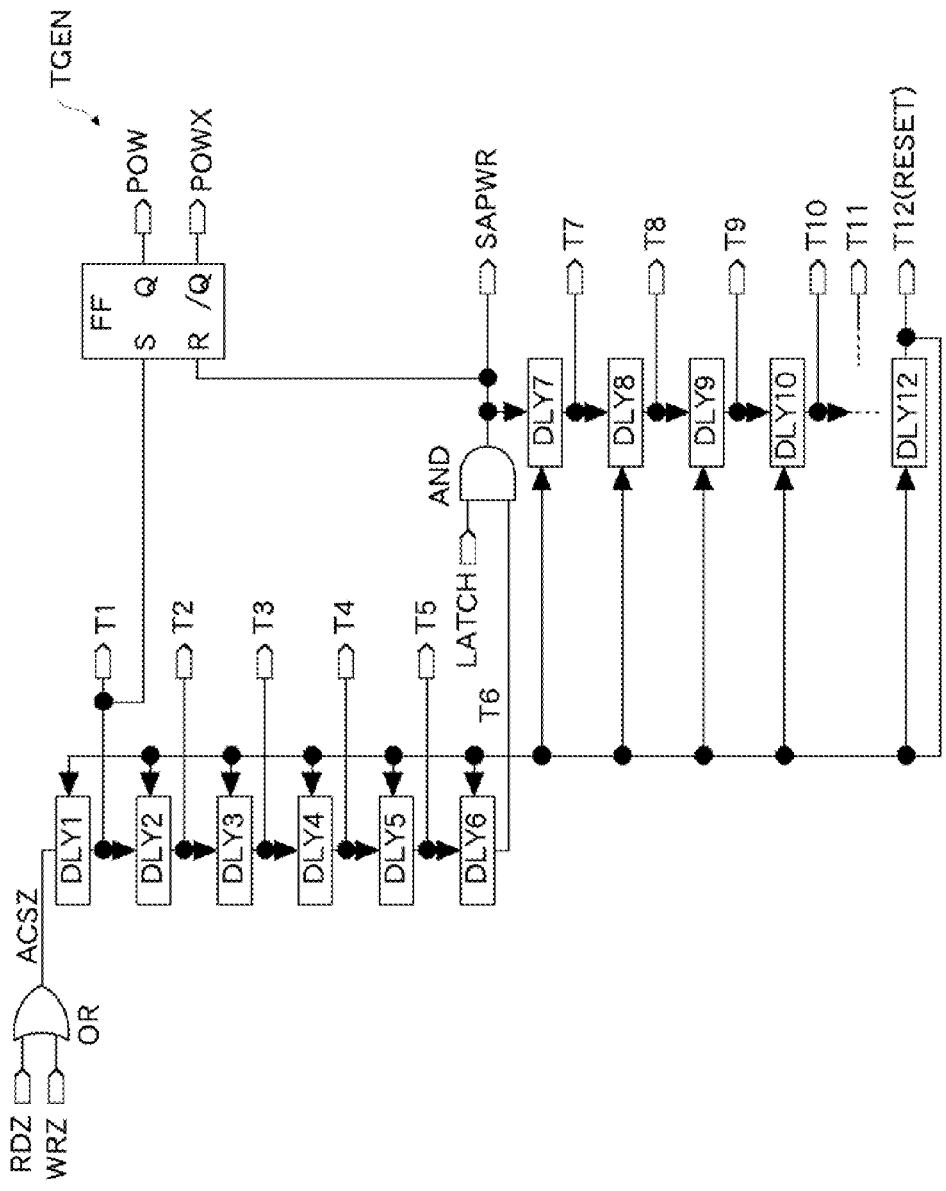
FIG. 15 illustrates a block diagram depicting the timing generator according to a third embodiment of the present invention.

FIG. 15 illustrates a timing generator TGEN of a third embodiment of the present invention. The same elements as those described in the first embodiment are given the same reference numerals, and detailed descriptions thereof are omitted. In this embodiment, an RS flip-flop FF is added to the timing generator TGEN of the first embodiment. The other structure is the same as in the first embodiment. That is, the semiconductor memory is the ferroelectric memory FM. The RS flip-flop FF activates the power control signals POW, POWX in synchronization with a rising edge of the timing signal T1, and inactivates the power control signals POW, POWX in synchronization with a rising edge of the sense amplifier power signal SAPWR.

Figure 16:
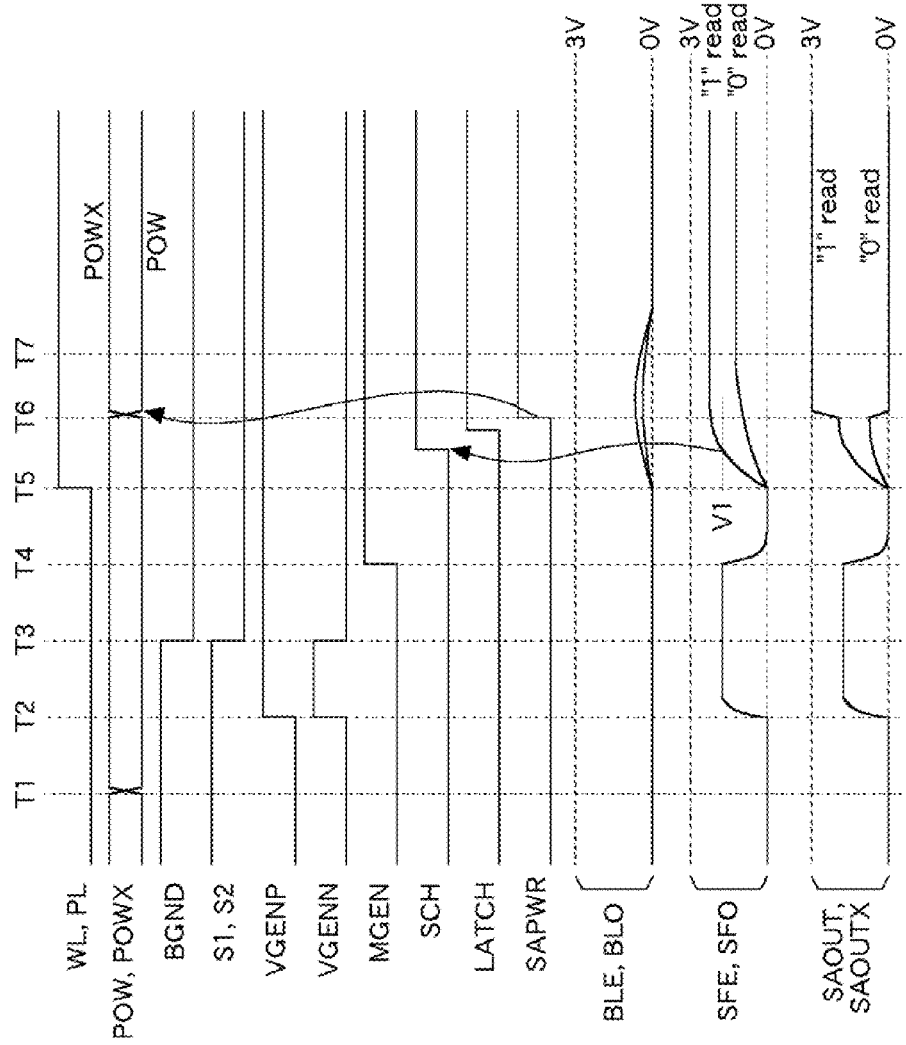
FIG. 16 illustrates a waveform chart depicting an example of an operation of the pre-sense amplifier and the sense amplifier according to the third embodiment.

FIG. 16 illustrates operations of the pre-sense amplifier PSA in the third embodiment and the sense amplifier SA in FIG. 4. Detailed descriptions of the same operations as in FIG. 7 are omitted. In this embodiment, the power control signals POW, POWX are inactivated in synchronization with a rising edge of the sense amplifier power signal SAPWR, and coupling of the power supply terminal (not illustrated) of the feedback inverter I1 of the pre-sense amplifier PSA illustrated in FIG. 3 and the power supply line VDD and the ground line is released. That is, in synchronization with the rising edge of the sense amplifier power signal SAPWR, the transistors PM2, NM2 (switch circuit) of the feedback inverter I1 turns off and the feedback inverter I1 is inactivated.

In the feedback inverter I1, an intermediate voltage between the power supply voltage VDD and the ground voltage is applied as an input voltage when operating, and thus a feed-through current flows from the power supply line VDD to the ground line. By cutting off the power supply to the feedback inverter I1 when its operation is not necessary, the power consumption during a read operation and a write operation is reduced. Incidentally, the feed-through current is cut off by releasing coupling of the feedback inverter I1 and either the power supply line VDD or the ground line. Therefore, the power consumption can be reduced by inactivating one of the power control signals POW, POWX in synchronization with the rising edge of the sense amplifier power signal SAPWR.

As above, also in the third embodiment, the same effect as in the above-described first embodiment can be obtained. Furthermore, in this embodiment, the power consumption of the ferroelectric memory FM can be reduced by reducing the feed-through current of the feedback inverter I1.

Figure 17:
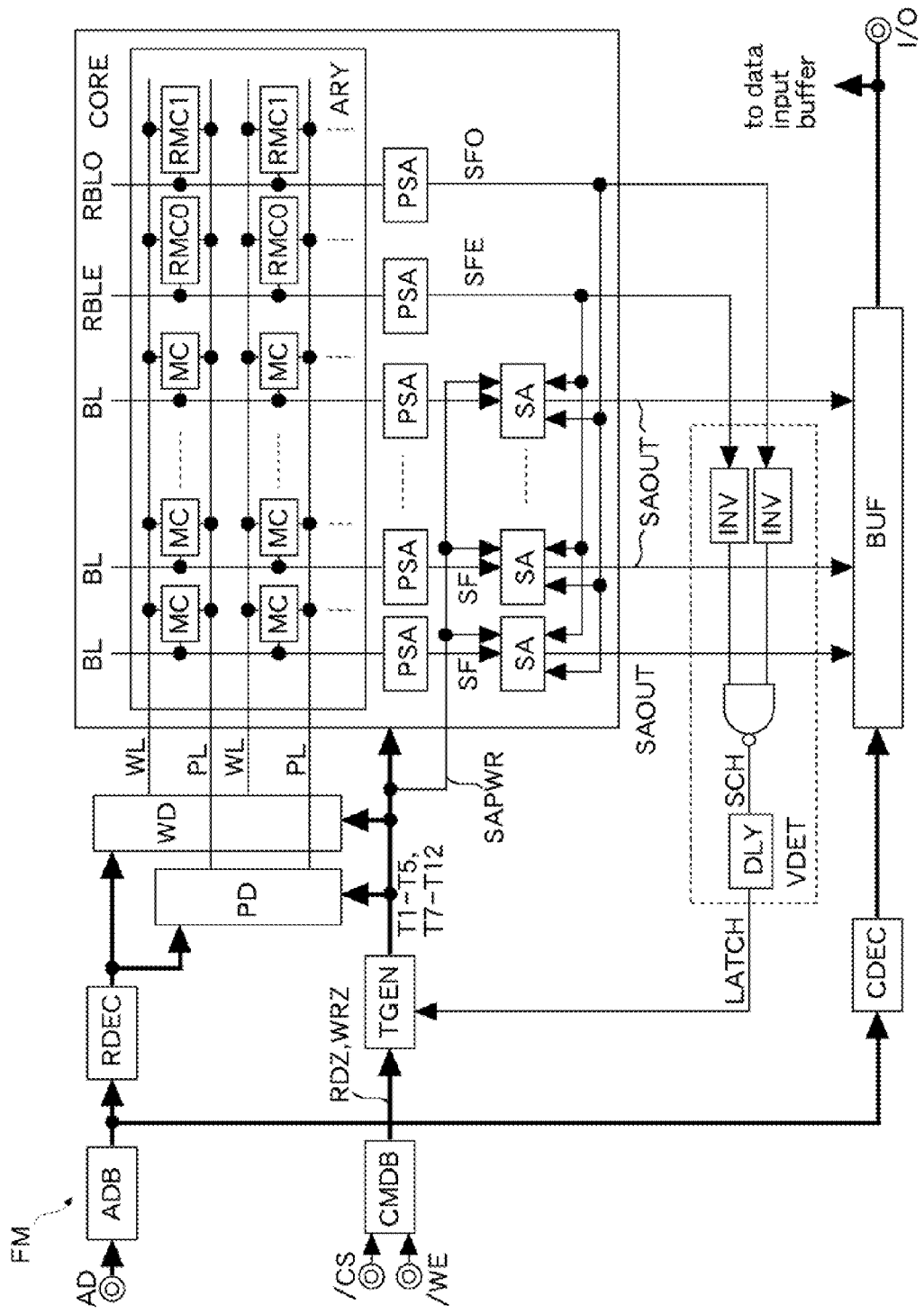
FIG. 17 illustrates a block diagram depicting a fourth embodiment of the semiconductor memory of the present invention.

FIG. 17 illustrates a fourth embodiment of the present invention. The same elements as those described in the first embodiment are given the same reference numerals, and detailed descriptions thereof are omitted. In this embodiment, the memory core CORE is different from that of the first embodiment. The other structure is the same as in the first embodiment. That is, the semiconductor memory is the ferroelectric memory FM.

The memory core CORE has a memory cell array ARY having memory cells MC (real memory cells) and reference memory cells RMC0, RMC1, pre-sense amplifiers PSA, and sense amplifiers SA. Each memory cell MC has one ferroelectric capacitor and one access transistor. This type of memory cell MC is generally referred to as 1T1C type.

The reference memory cells RMC0-1 are, for example, 1T1C type. Incidentally, the reference memory cells RMC0-1 may be 2T2C type instead of 1T1C type. Further, the structure and characteristics of the ferroelectric capacitors forming the reference memory cells RMC0-1 may be the same as or different from those of the ferroelectric capacitors of the real memory cells MC. The reference memory cell RMC0 (first reference memory cell) stores data "0" (first logic), and the reference memory cell RMC1 (second reference memory cell) stores data "1" (second logic).

The memory cells MC, RMC0-1 lined up horizontally in the diagram are each coupled to a common word line WL and a plate line PL. The columns of the memory cells MC lined up vertically in the diagram are each coupled to a common bit line BL. The column of the memory cells RMC0 and the column of the memory cells RMC1 are coupled to common reference bit lines RBLE, RBLO, respectively. Each of the bit lines BL, RBLE, RBLO is coupled to a pre-sense amplifier PSA.

The pre-sense amplifier coupled to a bit line BL outputs an output signal SF. The pre-sense amplifiers PSA coupled to the reference bit lines RBLE, RBLO respectively output the output signals SFE, SFO. The voltage detection circuit VDET generates the detection signal LATCH in response to the output signals SFE, SFO output from the pre-sense amplifiers PSA corresponding to the reference memory cells RMC0-1.

Further, the output signals SFE, SFO are supplied to the sense amplifiers SA as reference voltages for latching data retained in the memory cells MC. The sense amplifiers SA in this embodiment output only output signals SAOUT of positive logic to the data output buffer BUF. The data output buffer BUF selects 16 bits for example from read data of plural bits read from the memory core CORE according to the column decoding signal, and outputs the selected read data to the data input/output terminal I/O.

Figure 18:
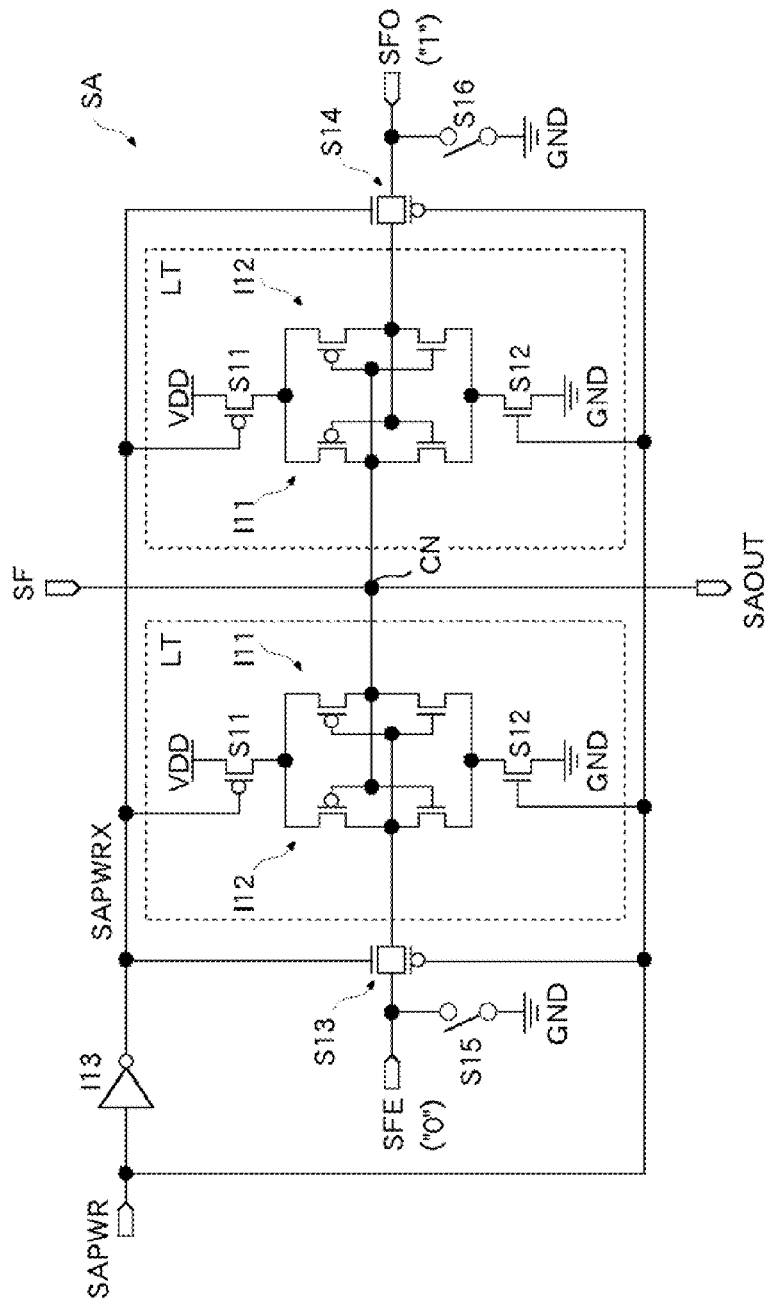
FIG. 18 illustrates a circuit diagram depicting the details of the sense amplifiers illustrated in FIG. 17.

FIG. 18 illustrates details of the sense amplifiers SA illustrated in FIG. 17. Each sense amplifier SA of this embodiment is made by adding a latch LT to the sense amplifier SA illustrated in FIG. 4. However, the output node SF of the pre-sense amplifier PSA corresponding to real memory cells MC is coupled to a common coupling node CN coupling the pair of latches LT. At the coupling node CN, the output nodes SF, SAOUT are coupled to each other. The switch S13 turns on while the sense amplifier power signal SAPWR is at low level, so as to transmit the output signal SFE of the pre-sense amplifier PSA corresponding to the reference memory cell RMC0 storing data "0" to the latches LT. The switch S14 turns on while the sense amplifier power signal SAPWR is at low level, so as to transmit the output signal SFO of the pre-sense amplifier PSA corresponding to the reference memory cell RMC1 storing data "1" to the latches LT. The other structure of the sense amplifier SA is the same as in FIG. 4.

During a low level period of the sense amplifier power signal SAPWR, each latch LT is inactivated. One input node of the latches LT receives the output signal SFE (or SFO), and the other input node of the latches receives the output signal SF. Then each latch LT is activated in synchronization with a rising edge of the sense amplifier power signal SAPWR, and amplifies the voltage difference between the output signal SFE (or SFO) and the output signal SF. Incidentally, the activation timing of the sense amplifier power signal SAPWR is the same as in the first embodiment.

Each memory cell MC retains data "0" or data "1". Accordingly, the voltage of the output signal SF becomes approximately equal to one of the output signals SFE, SFO. For example, when the memory cell MC retains data "0", there is almost no voltage difference between the signals SF, SFE which are input to the latch LT corresponding to the output signal SFE. Accordingly, insufficient differential amplification is performed, and it is difficult for the voltage difference to become large. In contrast, there is a large voltage difference between the signals SF, SFO which are input to the latch LT corresponding to the output signal SFO. Accordingly, sufficient differential amplification is performed, and the voltage difference becomes large instantly. As a result, the output node SAOUT of the sense amplifier SA changes to low level (ground voltage). In this manner, the sense amplifier SA determines the logic of data retained in each real memory cell MC with reference to the pair of voltage values SFE, SFO corresponding to charges read from the reference memory cells RMC0-1 respectively.

As above, also in the fourth embodiment, the same effects as those in the above-described first embodiment can be obtained. Furthermore, in this embodiment, when the ferroelectric memory FM has the real memory cells MC of 1T1C type, the sense amplifier power signal SAPWR can be generated using the reference memory cells RMC0-1. Consequently, data read from the real memory cells MC can be latched correctly in the sense amplifier SA, and malfunctions of the ferroelectric memory FM can be prevented.

Figure 19:
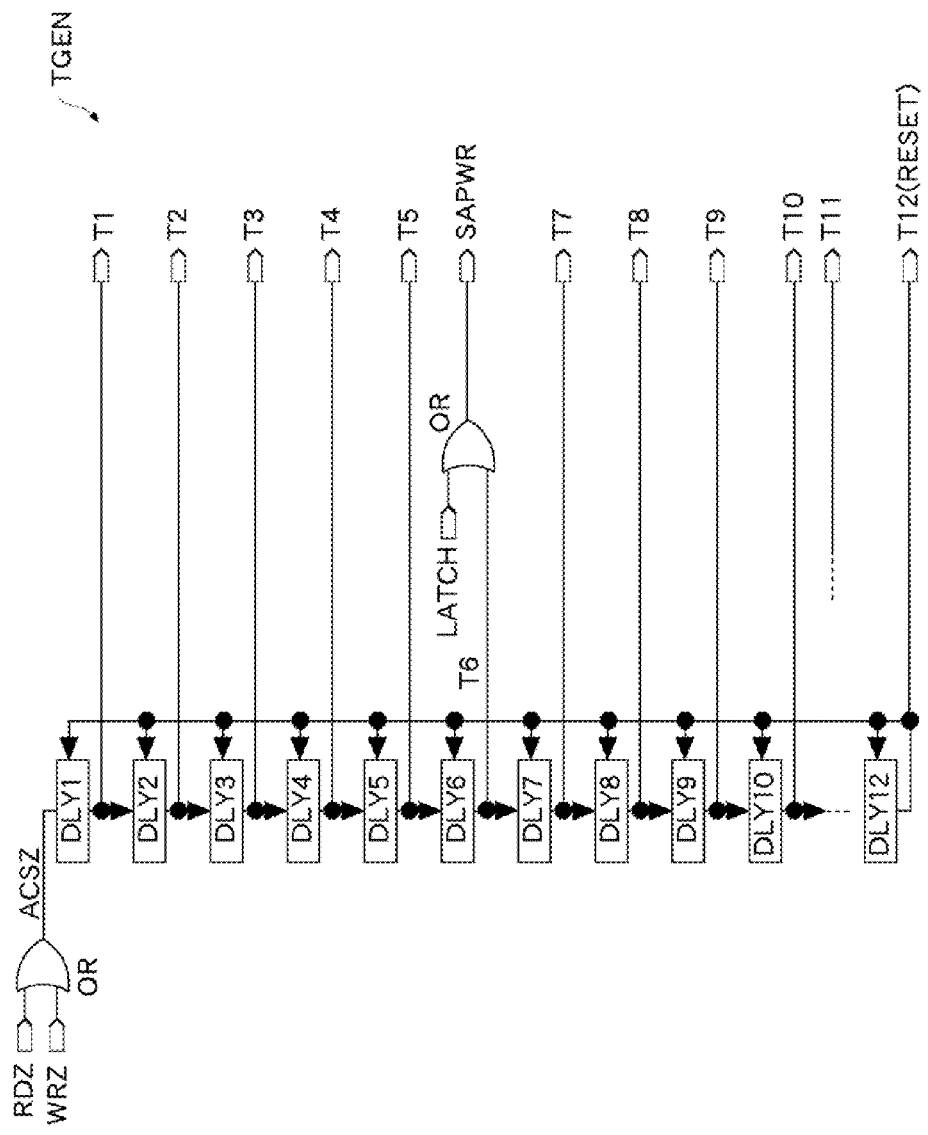
FIG. 19 illustrates a block diagram depicting a timing generator according to a fifth embodiment of the present invention.

FIG. 19 illustrates a timing generator TGEN of a fifth embodiment of the present invention. The same elements as those described in the first embodiment are given the same reference numerals, and detailed descriptions thereof are omitted. In this embodiment, an OR circuit is arranged in place of the AND circuit of the timing generator TGEN of the first embodiment. Further, the delay circuit DLY7 receives the timing signal T6. The OR circuit activates the sense amplifier power signal SAPWR to high level in synchronization with a rising edge of the timing signal T6 or the detection signal LATCH2. The other structure is the same as in the first embodiment. That is, the semiconductor memory is the ferroelectric memory FM.

In this embodiment, as illustrated in FIG. 14, even when the voltages of the output nodes SFE, SFO of the pre-sense amplifier PSA do not reach the first voltage V1, the sense amplifier power signal SAPWR is generated in synchronization with the timing signal T6. Accordingly, for example, even when the capacitance values of the ferroelectric capacitors F1, F2 are small, the sense amplifier power signal SAPWR can be generated securely, and the sense amplifiers SA can be operated at predetermined timings reliably.

As above, also in the fifth embodiment, the same effect as in the first and second embodiments can be obtained. Incidentally, this embodiment has a significant effect when the threshold voltages of the transistors forming the ferroelectric memory FM come within a predetermined range. Particularly, this embodiment allows stringent control of the side where the threshold voltages of the transistors are lower, and has a significant effect when the timing signal T6 is output always later than the detection signal LATCH when the capacitance values of the ferroelectric capacitors F1, F2 are standard.

Figure 20:
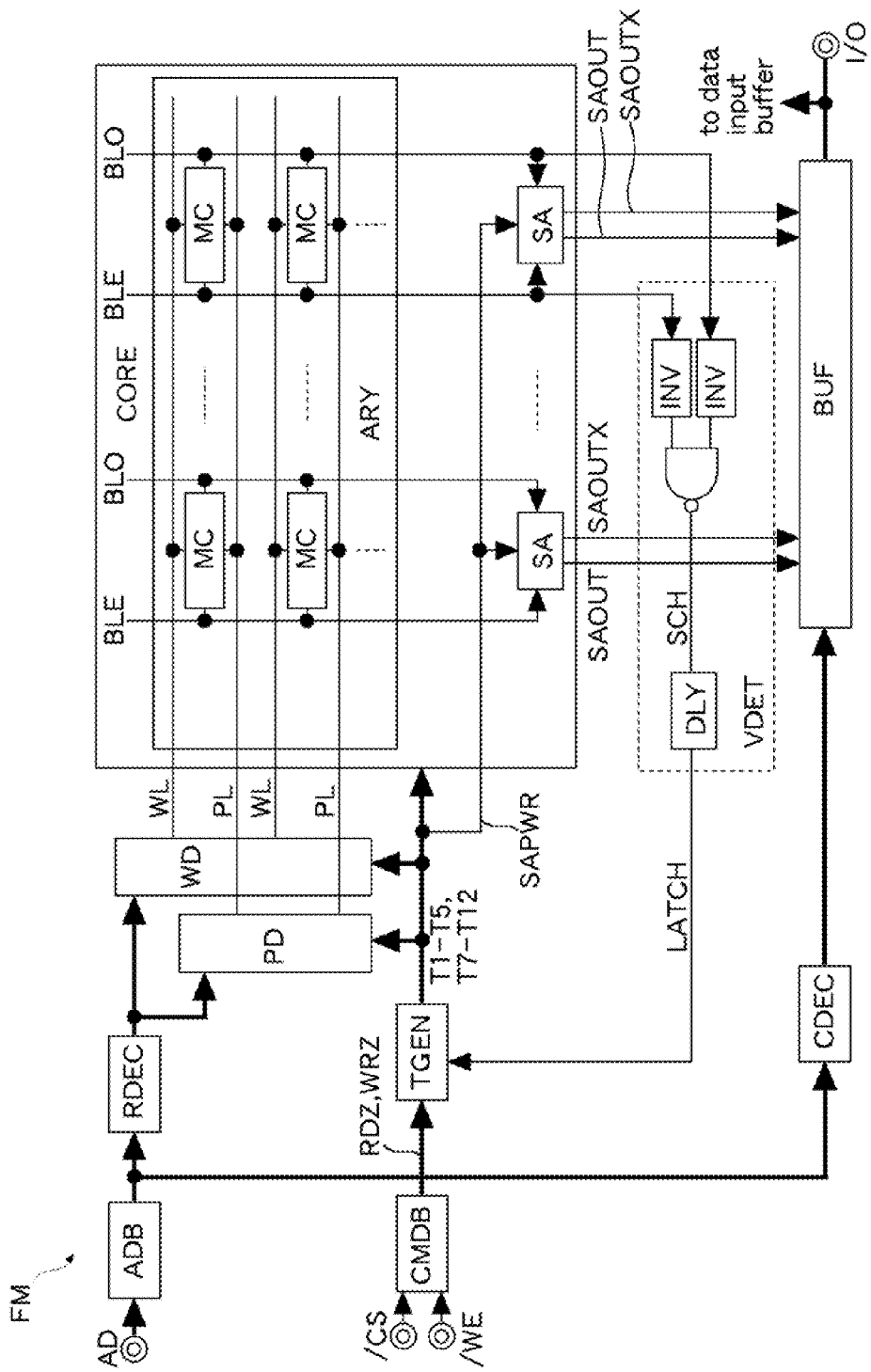
FIG. 20 illustrates a block diagram depicting a sixth embodiment of the semiconductor memory of the present invention.

FIG. 20 illustrates a sixth embodiment of the present invention. The same elements as those described in the first embodiment are given the same reference numerals, and detailed descriptions thereof are omitted. In this embodiment, the memory core CORE has no pre-sense amplifier PSA. Each sense amplifier SA is coupled directly to a pair of bit lines BLE, BLO. The other structure is the same as in the first embodiment. That is, the semiconductor memory is the ferroelectric memory FM.

Figure 21:
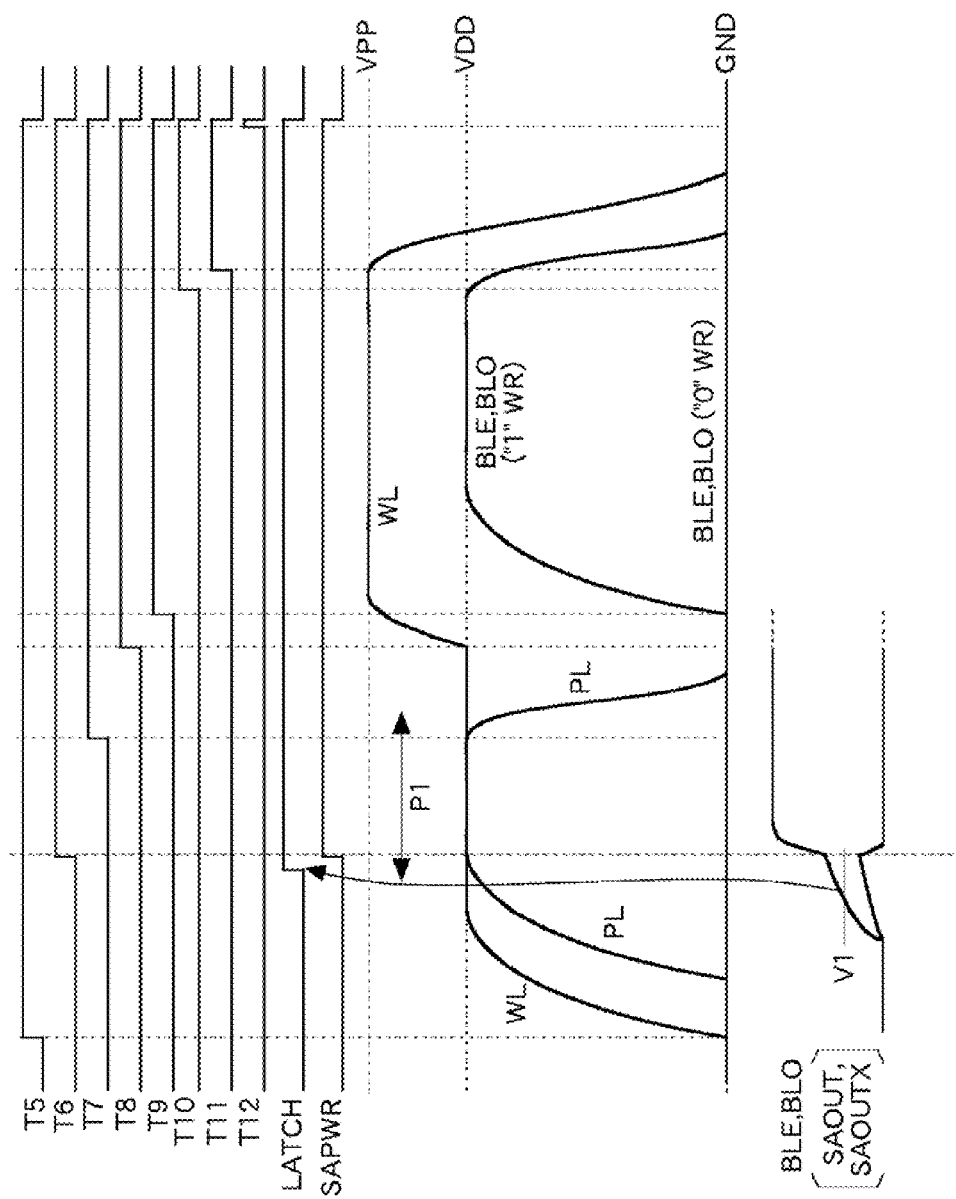
FIG. 21 illustrates a waveform chart depicting an access operation of the ferroelectric memory according to the sixth embodiment.

FIG. 21 illustrates an access operation of the ferroelectric memory FM in a sixth embodiment. Detailed descriptions of the same operations as in FIG. 10 are omitted. This example illustrates a situation that the threshold voltages of the transistors forming the ferroelectric memory FM are approximately equal to a standard value. In this example, the voltages of the bit line pair BLE, BLO change according to residual dielectric polarization values of the ferroelectric capacitors F1, F2 in response to a change of the plate line PL to high level. The voltage detection circuit VDET changes the detection signal LATCH to high level in response to that the value of one of the bit line pair BLE, BLO reaches the first voltage V1. The timing signal T6 is generated later than the detection signal LATCH. Accordingly, the timing generator TGEN generates the sense amplifier power signal SAPWR in synchronization with the timing signal T6. Then the sense amplifier SA amplifies the voltage difference between the bit line pair BLE, BLO in synchronization with the sense amplifier power signal SAPWR and latches data read from the memory cells MC.

As above, also in the sixth embodiment, the same effect as in the above-described first embodiment can be obtained. Furthermore, in this embodiment, also in the ferroelectric memory FM having no pre-sense amplifier PSA in which the voltage detection circuit VDET generates the detection signal LATCH in response to a change in voltage of the bit line BLE or BLO, data read from the memory cells MC can be latched correctly in the sense amplifier SA, and malfunctions of the ferroelectric memory FM can be prevented.

Incidentally, in the above-described embodiment (FIG. 5), there is described an example in which the voltage detection circuit VDET is formed using the inverter INV of schmitt trigger type. The present embodiments are not limited to such an embodiment, and the voltage detection circuit VDET can be formed with simpler circuits.

Figure 22:
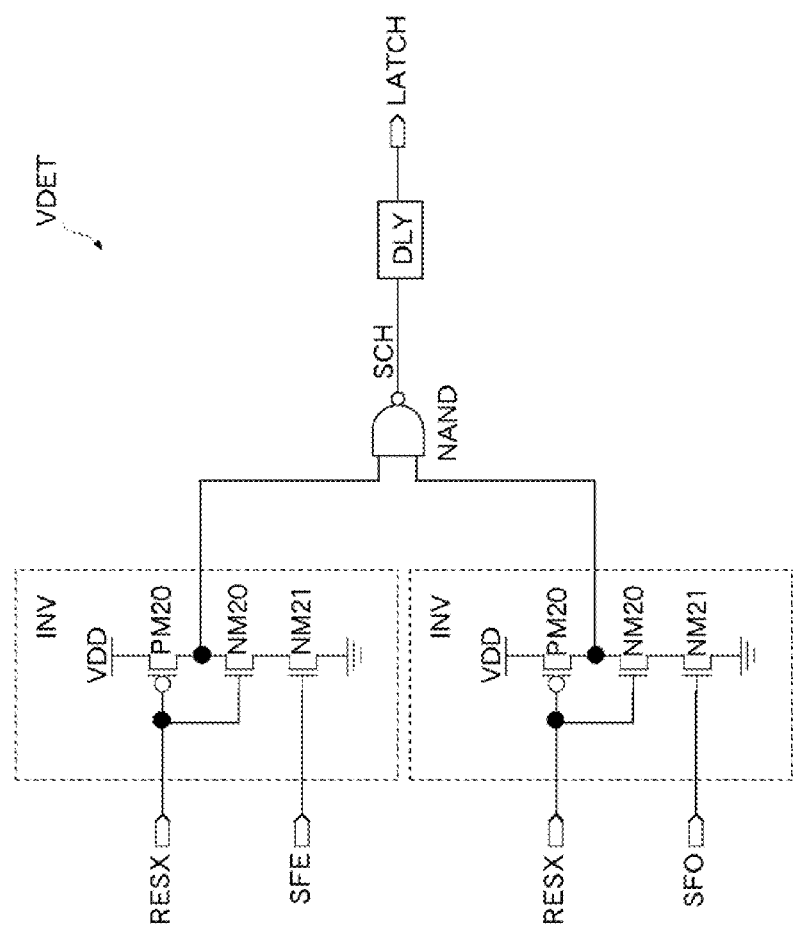
FIG. 22 illustrates a circuit diagram depicting another example of the voltage detection circuit.

FIG. 22 illustrates another example of the voltage detection circuit VDET. The voltage detection circuit VDET is different from FIG. 5 in structure of the inverters INV. Each inverter INV has a pMOS transistor PM20 and nMOS transistors NM20, NM21 which are coupled in series between the power supply line VDD and the ground line. The gates of the transistors PM20, NM20 receive a reset signal RESX. The gate of the transistor NM21 is coupled to the output node SFE or SFO of the pre-sense amplifier PSA. The drains of the transistors PM20, PM21 are coupled to inputs of the NAND gate.

In this example, the reset signal RESX is a signal having, for example, the same waveform as the timing signal T5 illustrated in FIG. 10. Each inverter INV is initialized in a low level period (before time T5) of the reset signal RESX to output high level, and changes to low level in response to rise of the voltage of the output node SFE (or SFO) in a high level period of the reset signal RESX. That is, the pre-sense amplifier PSA operates by an access request of the ferroelectric memory FM. When the voltage of one of the output nodes SFE, SFO exceeds the threshold voltage of the transistor NM21, the output of the inverter INV changes from high level to low level, and the output signal SCH and the detection signal LATCH change to high level sequentially.

In the above-described embodiments, there are described examples in which the present embodiments are applied to the ferroelectric memory FM having memory cells made of ferroelectric capacitors. The present embodiments are not limited to such embodiments. For example, the present embodiments may be applied to a semiconductor memory such as a DRAM having memory cells made of capacitors formed of an oxide film and so on.

The flip-flop FF in the third embodiment (FIG. 15) can be provided in the timing generators TGEN in the second, fourth, and fifth embodiments. The characteristics of the second embodiment can be applied to the fourth and sixth embodiments. The characteristics of the fifth embodiment can be applied to the fourth and sixth embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be mage hereto without departing from the spirit and scope of the invention.

What is claimed is:

1. A semiconductor memory, comprising:
 a plurality of memory cells each having a capacitor capable of storing an electric charge corresponding to a logic of data;
 bit lines coupled to each of the memory cells;
 a voltage detection circuit being provided corresponding to a pair of the bit lines from which complementary data are read, and outputting a detection signal when an amount of charges read to one of the pair of the bit lines reaches a predetermined amount when the memory cells are accessed;
 a timing generator having a plurality of cascade-coupled delay circuits, outputting timing signals from each of the delay circuits, and outputting a sense amplifier activation signal in response to one of the timing signals; and
 a sense amplifier determining logics of data read to the bit lines from the memory cells in synchronization with the sense amplifier activation signal, wherein
 the timing generator comprises a mask circuit masking an output of the sense amplifier activation signal until the detection signal is output, and
 a delay circuit in a next stage of one of the delay circuits outputting the one of the timing signals operates upon reception of the sense amplifier activation signal.

2. A semiconductor memory, comprising:
 a plurality of memory cells each having a capacitor capable of storing an electric charge corresponding to a logic of data;
 bit lines coupled to each of the memory cells;
 a voltage detection circuit being provided corresponding to a pair of the bit lines from which complementary data are read, and outputting a detection signal when information indicating an amount of charges read to one of the pair of the bit lines reached a predetermined amount is received;
 a timing generator having a plurality of cascade-coupled delay circuits, outputting timing signals from each of the delay circuits, and outputting a sense amplifier activation signal in response to either one of the detection signal and one of the timing signals, whichever be output earlier; and a sense amplifier determining logics of data read to the bit lines from the memory cells in synchronization with the sense amplifier activation signal.

3. The semiconductor memory according to claim 1, further comprising pre-sense amplifiers being coupled to each of the bit lines and amplifying voltage amplitude of data read from the memory cells via the bit lines, wherein the voltage detection circuit is coupled to a pair of the pre-sense amplifiers amplifying complementary data, and outputs the detection signal when a voltage value of data amplified by one of the pair of the pre-sense amplifiers reaches a first voltage when the memory cells are accessed, and the sense amplifier determines logics read to the bit lines from the memory cells upon reception of data amplified by the pre-sense amplifiers.

4. The semiconductor memory according to claim 3, wherein the pre-sense amplifiers each comprises:

a charge transferring circuit coupled to the bit lines;

a charge storing circuit being coupled to the bit lines via the charge transferring circuit, storing a charge read to the bit lines from the memory cells in a read operation, and generating a read voltage according to a stored charge; and a control circuit controlling a charge transfer capability of the charge transferring circuit according to a change in voltage of the bit lines caused by a read charge so as to transfer a charge read to the bit lines to the charge storing circuit; and wherein the control circuit comprises:

an inverter having an input coupled to the bit lines and an output coupled to a control terminal of the charge transferring circuit; and a switch circuit which turns on in response to start of the read operation so as to couple a power supply terminal of the inverter to a power supply line and turns off in response to an output of the sense amplifier activation signal.

5. The semiconductor memory according to claim 1, further comprising a delay circuit outputting a time-out signal at a predetermined time after data is read from the memory cells to the bit lines, wherein the mask circuit comprises a mask release circuit releasing a mask in response to an output of the time-out signal, so as to output the sense amplifier activation signal also when the detection signal is not output.

6. The semiconductor memory according to claim 1, further comprising:

a plate line which is coupled to one end of the capacitor and to which a high voltage is applied during a read operation; and a plate driver which is arranged in an arrangement direction of the bit lines with neighboring a memory cell array and which applies a voltage to the plate line, wherein the voltage detection circuit is provided corresponding to a bit line that is on a far side from the plate driver.

7. The semiconductor memory according to claim 1, wherein the capacitor is a ferroelectric capacitor.

8. The semiconductor memory according to claim 1, wherein the memory cells each comprises a pair of capacitors being coupled to one of pairs of the bit lines and storing electric charges corresponding to inverted logics from each other, and the voltage detection circuit is provided corresponding to the one of the pairs of the bit lines.

9. The semiconductor memory according to claim 1, wherein at least two of the memory cells are a first reference memory cell retaining a first logic in the capacitor and a second reference memory cell retaining a second logic that is an inverse of the first logic in the capacitor, remaining ones of the memory cells are real memory cells retaining data, the real memory cells each comprises one capacitor coupled to the bit lines and capable of storing an electric charge corresponding to a logic of data, the voltage detection circuit is provided corresponding to the first and second reference memory cells, and the sense amplifier determines a logic of data retained in each of the real memory cells with reference to a pair of voltage values corresponding to charges read from each of the first and second reference memory cells.

10. The semiconductor memory according to claim 1, wherein the voltage detection circuit comprises:

a CMOS inverter receiving an enable signal set to high logic level in a read operation through an input and outputting a detection signal from an output; and a detection transistor of nMOS type coupled between a source of an nMOS transistor of the CMOS inverter and a ground line, and a gate of the detection transistor is coupled to an output of the pre-sense amplifier, wherein the first voltage is a threshold voltage of the detection transistor.

11. The semiconductor memory according to claim 1, wherein the voltage detection circuit comprises an inverter of schmitt trigger type which detects amounts of charges read to the bit lines.

* * * * *